US009726954B2

(12) United States Patent
Amano

(10) Patent No.: US 9,726,954 B2
(45) Date of Patent: Aug. 8, 2017

(54) ACTIVE MATRIX SUBSTRATE WITH THIN FILM TRANSISTOR AND APERTURE PORTIONS, LIQUID CRYSTAL DISPLAY DEVICE, AND METHOD FOR MANUFACTURING ACTIVE MATRIX SUBSTRATE

(71) Applicant: Sharp Kabushiki Kaisha, Osaka-shi, Osaka (JP)

(72) Inventor: Tohru Amano, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 216 days.

(21) Appl. No.: 14/410,592

(22) PCT Filed: Jun. 18, 2013

(86) PCT No.: PCT/JP2013/066756
§ 371 (c)(1),
(2) Date: Dec. 23, 2014

(87) PCT Pub. No.: WO2014/002834
PCT Pub. Date: Jan. 3, 2014

(65) Prior Publication Data
US 2015/0168759 A1 Jun. 18, 2015

(30) Foreign Application Priority Data
Jun. 25, 2012 (JP) .................................. 2012-142046

(51) Int. Cl.
*G02F 1/1368* (2006.01)
*G02F 1/1362* (2006.01)
(Continued)

(52) U.S. Cl.
CPC ...... *G02F 1/1368* (2013.01); *G02F 1/136227* (2013.01); *G02F 1/136286* (2013.01);
(Continued)

(58) Field of Classification Search
CPC .......... G02F 1/136213; G02F 2201/40; G02F 1/136227; G02F 2001/134345;
(Continued)

(56) References Cited

U.S. PATENT DOCUMENTS 6,856,360 B1 2/2005 Higuchi et al.
2002/0041354 A1 4/2002 Noh et al.
(Continued)

FOREIGN PATENT DOCUMENTS

JP 11-218783 A 8/1999
JP 2002-182230 A 6/2002
(Continued)

*Primary Examiner* — Huyen Ngo
(74) *Attorney, Agent, or Firm* — Keating & Bennett, LLP

(57) ABSTRACT

An active matrix substrate (100A) includes a TFT (20), a scanning line (11) substantially parallel to a first direction, a signal line (12) substantially parallel to a second direction which is orthogonal to the first direction, a first interlayer insulating layer (16) covering the TFT, a lower layer electrode (17) provided on the first interlayer insulating layer, a dielectric layer (18) provided on the lower layer electrode, and an upper layer electrode (19) overlapping at least a portion of the lower layer electrode via the dielectric layer. A first contact hole (31) includes a first aperture (16a) formed in the first interlayer insulating layer and a second aperture (18a) formed in the dielectric layer. A width of the first aperture along one of the first direction and the second direction is smaller than a width of the second aperture along the one direction. A portion of the contour of the second aperture is located inside the contour of the first aperture, and the contour of the second aperture is not rectangular. The area of the portion of the second aperture not overlapping the first aperture is smaller than that in an imaginary case where the contour of the second aperture is rectangular.

18 Claims, 31 Drawing Sheets

(51) Int. Cl.
  *H01L 27/12* (2006.01)
  *H01L 29/786* (2006.01)
  *G02F 1/1339* (2006.01)
  *G02F 1/1343* (2006.01)
  *G03F 7/00* (2006.01)

(52) U.S. Cl.
  CPC ........ H01L 27/124 (2013.01); H01L 27/1259 (2013.01); H01L 29/7869 (2013.01); *G02F 1/13394* (2013.01); *G02F 1/134309* (2013.01); *G02F 2001/13629* (2013.01); *G02F 2001/136295* (2013.01); *G03F 7/0005* (2013.01); *H01L 27/1225* (2013.01)

(58) Field of Classification Search
  CPC ........... G02F 2201/122; H01L 2924/00; H01L 28/55; H01L 27/1225; H01L 29/786; H01L 29/7869
  USPC .................................. 349/43; 257/72; 438/34
  See application file for complete search history.

(56) References Cited

U.S. PATENT DOCUMENTS

| | | |
|---|---|---|
| 2003/0048401 A1 | 3/2003 | Hanaoka et al. |
| 2007/0262352 A1* | 11/2007 | Hirabayashi ...... G02F 1/136213 257/213 |
| 2009/0103033 A1* | 4/2009 | Chen ................. G02F 1/133753 349/139 |
| 2011/0050551 A1 | 3/2011 | Ota et al. |
| 2012/0154705 A1* | 6/2012 | Ahn .................. G02F 1/136213 349/46 |
| 2014/0375921 A1* | 12/2014 | Moriya ............. G02F 1/136227 349/43 |

FOREIGN PATENT DOCUMENTS

| | | |
|---|---|---|
| JP | 2002-357830 A | 12/2002 |
| JP | 2011-053443 A | 3/2011 |
| WO | 2013/073495 A1 | 5/2013 |

* cited by examiner

FIG.2
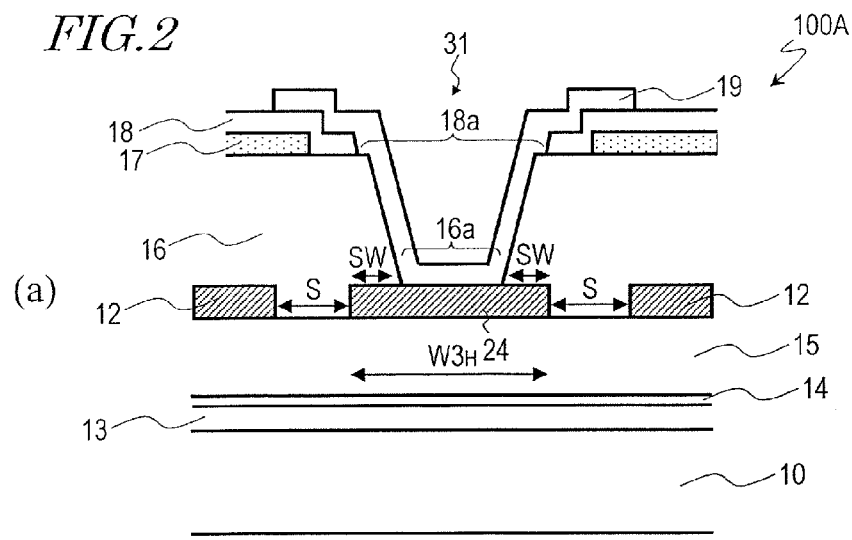
(a)
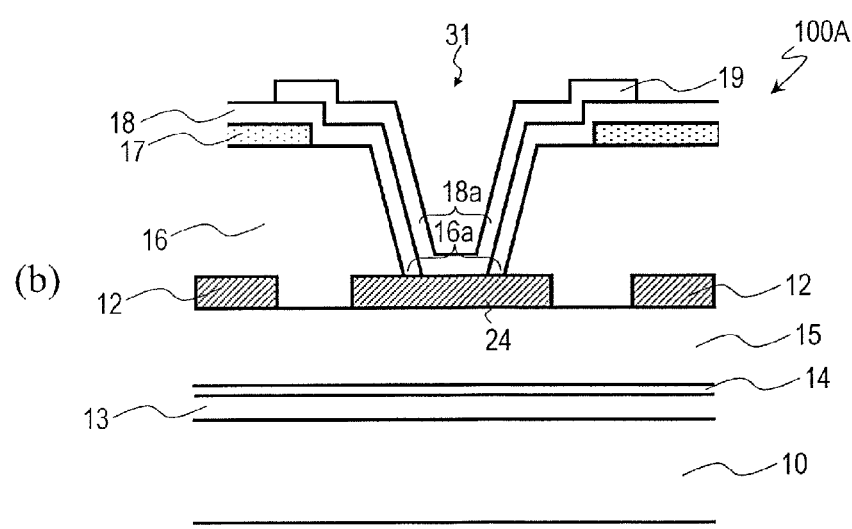
(b)
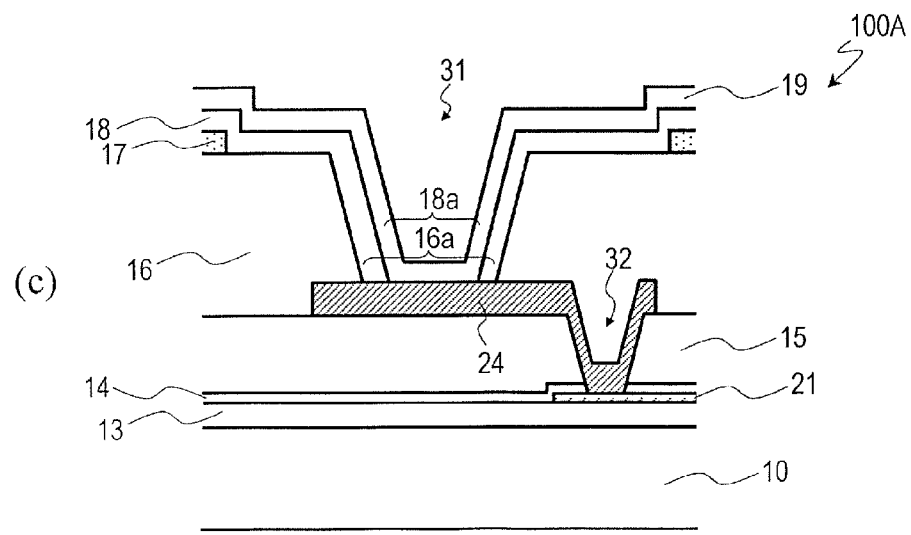
(c)

FIG. 7
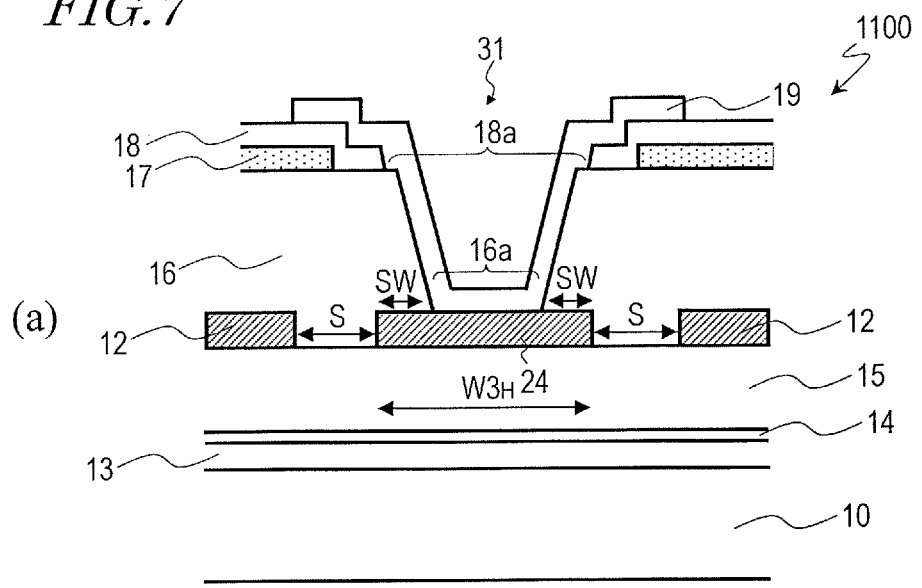
(a)
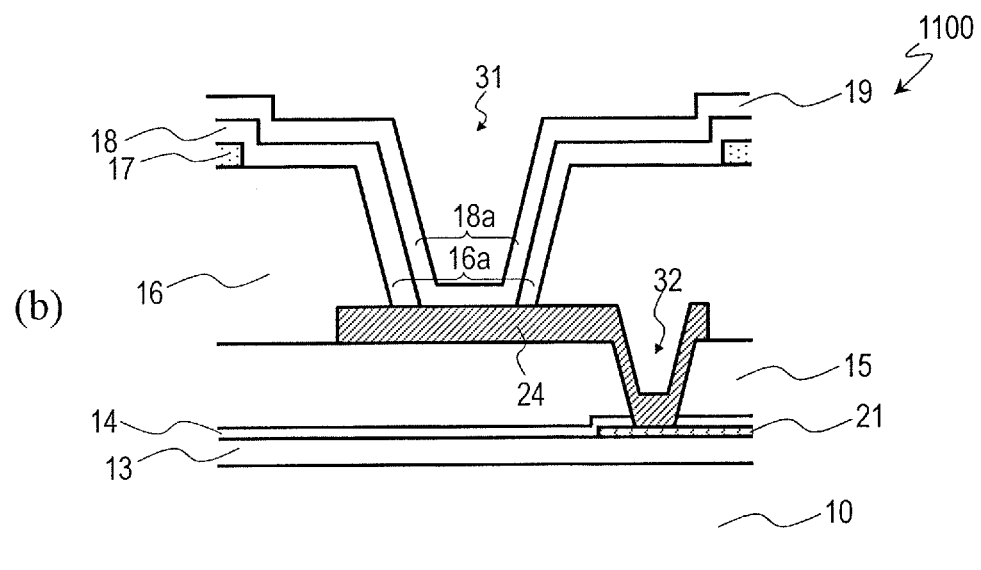
(b)

FIG.10
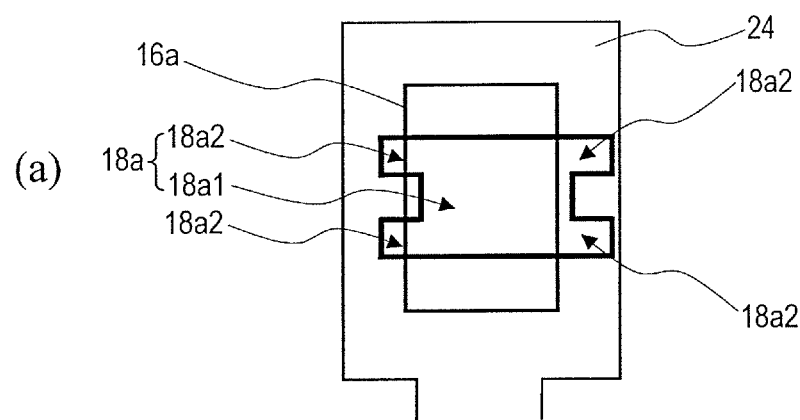
(a)
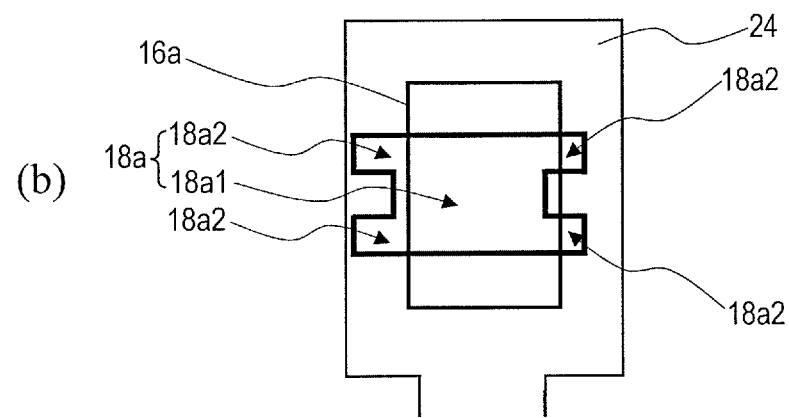
(b)

FIG. 13
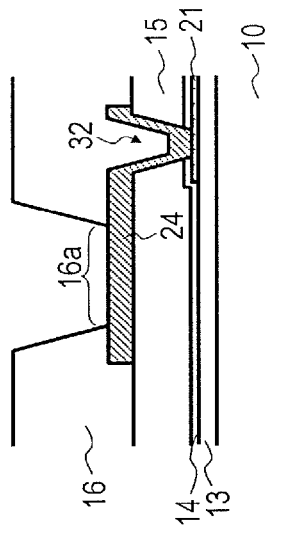
(a1)
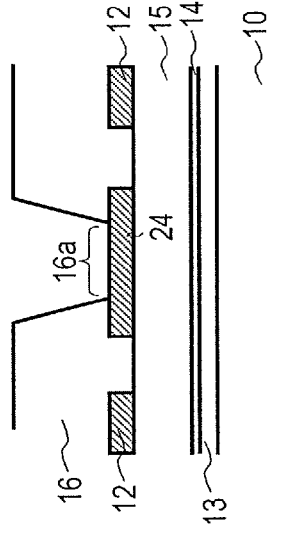
(b1)
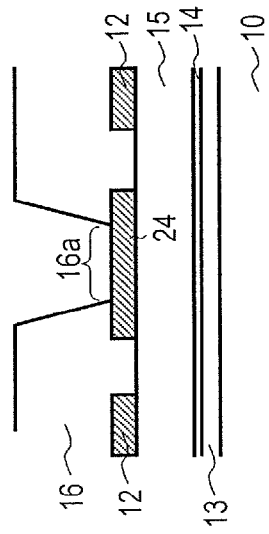
(c1)
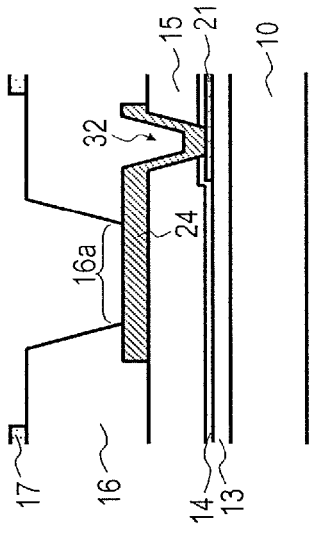
(a2)
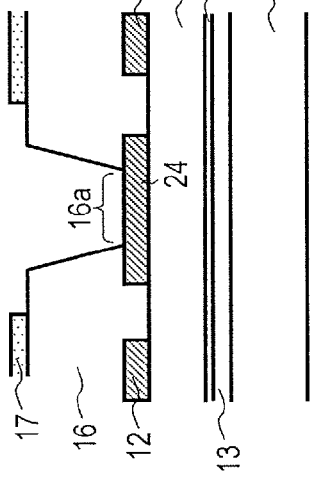
(b2)
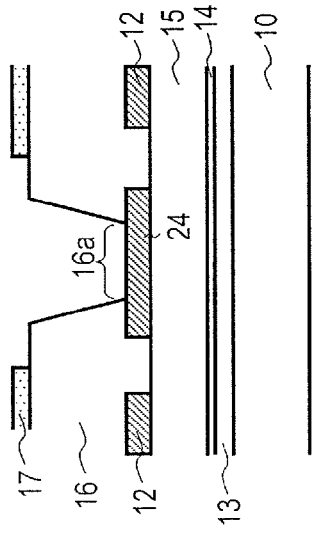
(c2)

(a)

(b)

FIG.24
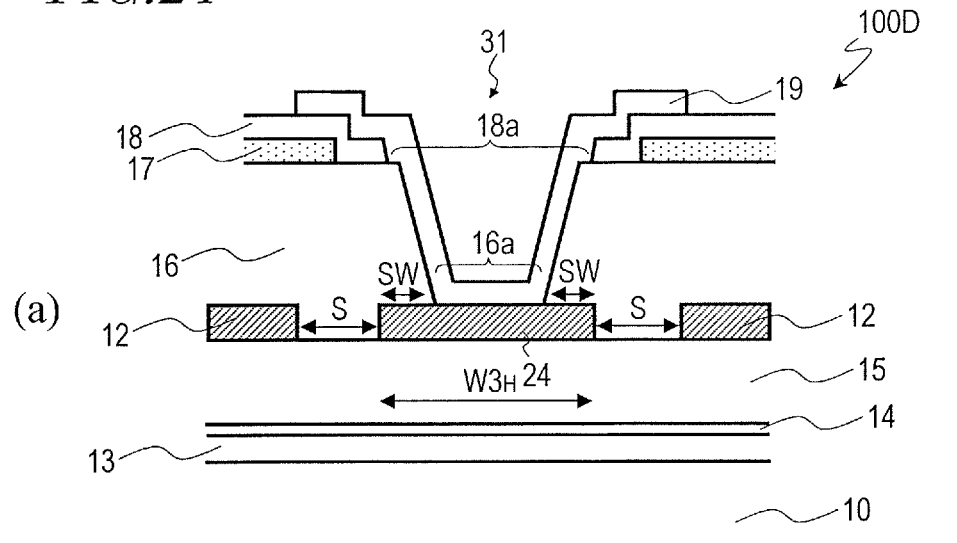
(a)
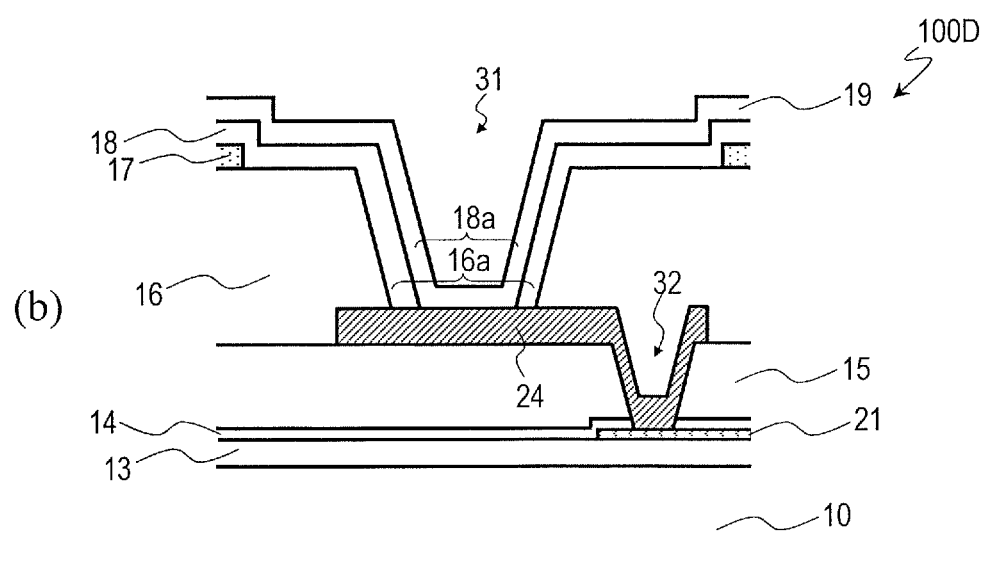
(b)

ACTIVE MATRIX SUBSTRATE WITH THIN FILM TRANSISTOR AND APERTURE PORTIONS, LIQUID CRYSTAL DISPLAY DEVICE, AND METHOD FOR MANUFACTURING ACTIVE MATRIX SUBSTRATE

TECHNICAL FIELD

The present invention relates to an active matrix substrate, and more particularly to an active matrix substrate having two-layered electrodes, including an upper layer electrode and a lower layer electrode. Moreover, the present invention relates to a liquid crystal display device having such an active matrix substrate, and a method of producing such an active matrix substrate.

BACKGROUND ART

Liquid crystal display devices, due to their thinness and low power consumption, are broadly used in various fields. In particular, active-matrix type liquid crystal display devices have high performance with a high contrast ratio and excellent response characteristics, and are used for television sets, monitors, and laptop personal computers; they are increasing in market size in the recent years.

Generally speaking, an active-matrix type liquid crystal display device includes an active matrix substrate (also referred to as a "TFT substrate") on which thin film transistors (TFTs) are formed as switching elements corresponding to the respective pixels, a counter substrate (also referred to as a "color filter substrate") on which color filters and the like are formed, and a liquid crystal layer provided between the active matrix substrate and the counter substrate. An electric field which is in accordance with the potential difference between the common electrode and a pixel electrode electrically connected to a thin film transistor is applied across the liquid crystal layer, this electric field causing a change in the alignment state of liquid crystal molecules in the liquid crystal layer, thereby controlling the light transmittance of each pixel to enable displaying.

Depending on the application, various display modes have been proposed and adopted in active-matrix type liquid crystal display devices. Examples of display modes include the TN (Twisted Nematic) mode, the VA (Vertical Alignment) mode, the IPS (In-Plane-Switching) mode, and the FFS (Fringe Field Switching) mode.

In some display modes, a "two-layer electrode structure" is adopted for the active matrix substrate. A two-layer electrode structure includes the following, on an interlayer insulating layer covering thin film transistors: a lower layer electrode(s), a dielectric layer covering the lower layer electrode(s), and an upper layer electrode(s) overlying the lower layer electrode(s) via the dielectric layer. For example, in the commonly-used FFS mode, as is disclosed in Patent Document 1, a common electrode is provided as a lower layer electrode, and pixel electrodes having a plurality of slits formed therein are provided as upper layer electrodes. Both the common electrode and the pixel electrodes are made of a transparent electrically conductive material. As is disclosed in Patent Document 2, a construction is also known for the FFS mode where pixel electrodes are provided as lower layer electrodes, and a common electrode having a plurality of slits formed therein is provided as an upper layer electrode.

For reasons that will be described in detail later, a two-layer electrode structure may possibly be adopted irrespective of the display mode (that is, also in the VA mode and the like).

When adopting a two-layer electrode structure featuring pixel electrodes as upper layer electrodes, in order to electrically connect a pixel electrode to the drain electrode of a thin film transistor, an aperture through which to expose a portion of the drain electrode must be formed in both the interlayer insulating layer covering the thin film transistor and the dielectric layer located between the electrodes. By forming the pixel electrode so as to be in contact with the drain electrode in a contact hole which includes an aperture through the interlayer insulating layer and an aperture through the dielectric layer, the pixel electrode is allowed to be electrically connected to the drain electrode.

In this case, the etching to form the aperture in the dielectric layer will also erode the tapered portion (slanted side face) of the aperture in the interlayer insulating layer, thus allowing the side face shape of the contact hole to become steep. As a result, the pixel electrode, having a relatively small thickness, may become disrupted in the contact hole (called "stepping"). Therefore, in order to avoid insufficient connection due to stepping of the pixel electrode, the aperture in the dielectric layer is formed so that it wholly fits within the aperture in the interlayer insulating layer when viewed from the normal direction of the substrate.

CITATION LIST

Patent Literature

[Patent Document 1] Japanese Laid-Open Patent Publication No. 2002-182230

[Patent Document 2] Japanese Laid-Open Patent Publication No. 2011-53443

SUMMARY OF INVENTION

Technical Problem

However, since the dielectric layer has a large film thickness to be etched, the aperture in the dielectric layer is likely to have a large finished diameter along the plane of the substrate. Therefore, the aperture in the interlayer insulating layer, within which the aperture in the dielectric layer is contained, inevitably needs to have a large diameter, too.

On the other hand, the drain electrode serves not only to provide electrical connection to the pixel electrode, but also to shade regions in which the liquid crystal molecules have disorderly alignment, near the tapered portion of the aperture in the interlayer insulating layer. Therefore, when the aperture in the interlayer insulating layer increases in diameter, the drain electrode size must also be increased.

The drain electrodes are typically in the same layer as the signal lines (that is, they are formed by patterning the same electrically conductive film). Therefore, when a liquid crystal display device having high definition is given a standard pixel construction in which the ratio between the pixel pitch along the horizontal direction and the pixel pitch along the vertical direction (H/V ratio) is 1:3, it is impossible to ensure sufficient intralayer spaces along the horizontal direction if a large drain electrode size exists for the aforementioned reason. This will impose constrains as to definition, thus making manufacture difficult at high definitions. Specifically, manufacture at pixel densities of 370 ppi or more will become difficult.

The present invention has been made in view of the above problems, and an objective thereof is to provide an active matrix substrate which can be produced with a higher definition than conventionally, in spite of having a two-layer electrode structure.

Solution to Problem

An active matrix substrate according to an embodiment of the present invention comprises: a substrate; a thin film transistor being supported by the substrate and including a semiconductor layer, a gate electrode, a source electrode, and a drain electrode; a scanning line provided so as to extend substantially parallel to a first direction, and electrically connected to the gate electrode of the thin film transistor; a signal line provided so as to extend substantially parallel to a second direction orthogonal to the first direction, and electrically connected to the source electrode of the thin film transistor; a first interlayer insulating layer provided so as to cover the thin film transistor; a lower layer electrode provided on the first interlayer insulating layer; a dielectric layer provided on the lower layer electrode; and an upper layer electrode being provided on the dielectric layer and overlapping at least a portion of the lower layer electrode via the dielectric layer, wherein, a first contact hole through which a portion of the drain electrode is exposed is formed in the first interlayer insulating layer and the dielectric layer, the first contact hole allowing the upper layer electrode to be electrically connected to the drain electrode; the first contact hole includes a first aperture formed in the first interlayer insulating layer and a second aperture formed in the dielectric layer; a width of the first aperture along one of the first direction and the second direction is smaller than a width of the second aperture along the one direction; when viewed from a normal direction of the substrate, a portion of the contour of the second aperture is located inside the contour of the first aperture, and the contour of the second aperture is not rectangular; and the area of a portion of the second aperture not overlapping the first aperture is smaller than that in an imaginary case where the contour of the second aperture is a rectangle whose width along the first direction and whose width along the second direction are identical to those of the contour of the second aperture.

In one embodiment, when viewed from the normal direction of the substrate, the contour of the first aperture is rectangular.

In one embodiment, when viewed from the normal direction of the substrate, the second aperture includes a first portion overlapping the first aperture, and a plurality of second portions extending from the first portion and not overlapping the first aperture; and the plurality of second portions include at least one second portion located on one side of the first portion along the one direction and at least another second portion located on another side.

In one embodiment, the plurality of second portions are four second portions; and two of the four second portions are located on one side of the first portion along the one direction, and the other two are located on another side.

In one embodiment, when viewed from the normal direction of the substrate, the contour of the second aperture is H-shaped.

In one embodiment, wherein, the plurality of second portions are two second portions; and one of the two second portions is located on one side of the first portion along the one direction, and the other is located on another side.

In one embodiment, when viewed from the normal direction of the substrate, the contour of the second aperture is a parallelogram.

In one embodiment, when viewed from the normal direction of the substrate, the contour of the second aperture includes two sides which are substantially parallel to the one direction, each being located partially inside the contour of the first aperture.

In one embodiment, when viewed from the normal direction of the substrate, the contour of the second aperture includes two sides which are inclined with respect to the one direction, each being located partially inside the contour of the first aperture.

In one embodiment, a width of the first aperture along the other of the first direction and the second direction is greater than a width of the second aperture along the other direction.

In one embodiment, in the first contact hole, the upper layer electrode is in contact with the drain electrode.

In one embodiment, the active matrix substrate of the above construction further comprises: a gate insulating layer provided between the semiconductor layer and the gate electrode; and a second interlayer insulating layer provided so as to cover the gate electrode or the semiconductor layer, wherein, between the gate insulating layer and the second interlayer insulating layer, at least the second interlayer insulating layer has a second contact hole formed therein through which a portion of the semiconductor layer is exposed, the second contact hole allowing the drain electrode to be electrically connected to the semiconductor layer; and when viewed from the normal direction of the substrate, at least a portion of the second contact hole overlaps the first contact hole.

In one embodiment, when viewed from the normal direction of the substrate, a center of the first contact hole and a center of the second contact hole are deviated.

In one embodiment, the upper layer electrode and the lower layer electrode are each made of a transparent electrically conductive material.

In one embodiment, a width of the first aperture along the first direction is smaller than a width of the second aperture along the first direction.

In one embodiment, the semiconductor layer of the thin film transistor comprises an oxide semiconductor.

In one embodiment, the oxide semiconductor is an In—Ga—Zn—O-type semiconductor.

A liquid crystal display device according to an embodiment of the present invention comprises: the active matrix substrate of the above construction; a counter substrate provided opposite from the active matrix substrate; and a liquid crystal layer provided between the active matrix substrate and the counter substrate.

In one embodiment, the liquid crystal display device of the above construction has a plurality of pixels in a matrix arrangement, wherein the upper layer electrode functions as a pixel electrode.

In one embodiment, the upper layer electrode has a plurality of slits.

In one embodiment, the lower layer electrode, the dielectric layer, and the upper layer electrode constitute a storage capacitor.

A method for producing an active matrix substrate according to an embodiment of the present invention is a method of producing an active matrix substrate including: a thin film transistor including a semiconductor layer, a gate electrode, a source electrode, and a drain electrode; a scanning line provided so as to extend substantially parallel to a first direction, and electrically connected to the gate electrode of the thin film transistor; and a signal line provided so as to extend substantially parallel to a second direction orthogonal to the first direction, and electrically connected to the source electrode of the thin film transistor, the method comprising: step (A) of forming the thin film transistor on a substrate; step (B) of forming an interlayer insulating layer covering the thin film transistor, the interlayer insulating layer having a first aperture; step (C) of forming a lower layer electrode on the interlayer insulating layer; step (D) of forming on the lower layer electrode a dielectric layer having a second aperture; and step (E) of forming on the dielectric layer an upper layer electrode overlapping at least a portion of the lower layer electrode via the dielectric layer, the upper layer electrode being electrically connected to the drain electrode in a contact hole, the contact hole including the first aperture and the second aperture, wherein, step (B) and step (D) are performed so that a width of the first aperture along one of the first direction and the second direction is smaller than a width of the second aperture along the one direction, and that, when viewed from a normal direction of the substrate, a portion of the contour of the second aperture is located inside the contour of the first aperture; and step (B) and step (D) are performed further so that, when viewed from the normal direction of the substrate, the contour of the second aperture is not rectangular, and that the area of a portion of the second aperture not overlapping the first aperture is smaller than that in an imaginary case where the contour of the second aperture is a rectangle whose width along the first direction and whose width along the second direction are identical to those of the contour of the second aperture.

Advantageous Effects of Invention

According to an embodiment of the present invention, there is provided an active matrix substrate which can be produced with a higher definition than conventionally, in spite of having a two-layer electrode structure.

BRIEF DESCRIPTION OF DRAWINGS

[FIG. 2] A diagram schematically showing the active matrix substrate 100A according to an embodiment of the present invention, where (a), (b), and (c) are cross-sectional views taken along line 2A-2A', line 2B-2B', and line 2C-2C' in FIG. 1, respectively.

[FIG. 7] A diagram schematically showing the active matrix substrate 1100 according to Comparative Example 2, where (a) and (b) are cross-sectional views taken along line 7A-7A' and line 7B-7B' in FIG. 6, respectively.

[FIG. 10] (a) and (b) are diagrams showing the second aperture 18a in the active matrix substrate 100A according to an embodiment of the present invention being deviated from the intended position due to misalignment.

[FIG. 13] Step-by-step cross-sectional views showing a method of producing the active matrix substrate 100A according to an embodiment of the present invention, where (a1) and (a2) correspond to a cross section taken along line 2A-2A' n FIG. 1; (b1) and (b2) correspond to a cross section taken along line 2B-2B' in FIG. 1; and (c1) and (c2) correspond to a cross section taken along line 2C-2C' in FIG. 1.

[FIG. 24] A diagram schematically showing the active matrix substrate 100D according to an embodiment of the present invention, where (a) and (b) are cross-sectional views taken along line 24A-24A' and line 24B-24B' in FIG. 23, respectively.

DESCRIPTION OF EMBODIMENTS

Hereinafter, embodiments of the present invention will be described with reference to the drawings. Note that the present invention is not limited to the following embodiments.

(Embodiment 1)

Figure 1:
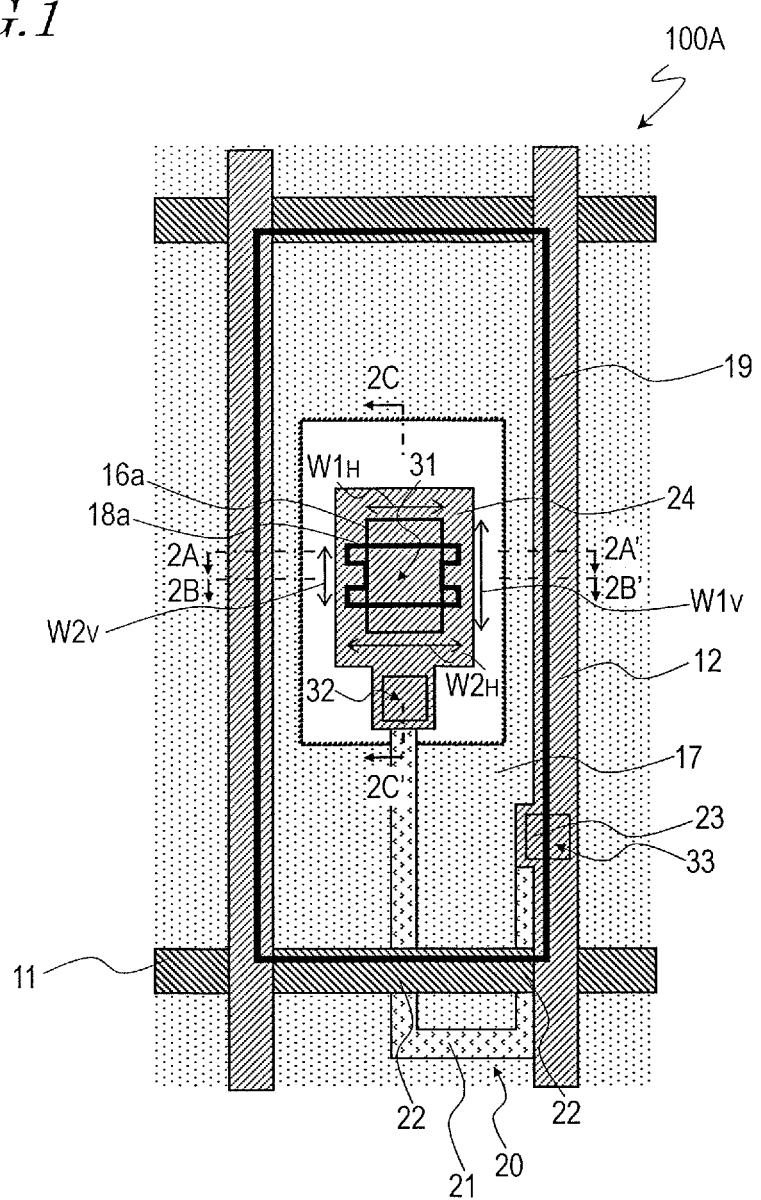
[FIG. 1] A diagram schematically showing an active matrix substrate 100A according to an embodiment of the present invention, as a plan view showing a region corresponding to one pixel.

FIG. 1 and FIG. 2 show an active matrix substrate 100A according to the present embodiment. FIG. 1 is a plan view schematically showing the active matrix substrate 100A. FIGS. 2(a), (b), and (c) are cross-sectional views taken along line 2A-2A', line 2B-2B', and 2C-2C' in FIG. 1, respectively.

The active matrix substrate 100A is used for a liquid crystal display device which performs displaying in the VA mode. The liquid crystal display device includes a plurality of pixels in a matrix arrangement. FIG. 1 shows a region corresponding to one pixel of the liquid crystal display device.

As shown in FIG. 1 and FIGS. 2(a) to (b), the active matrix substrate 100A includes a substrate 10, thin film transistors (TFTs) 20, scanning lines 11, and signal lines 12.

The substrate 10 is transparent and insulative. The substrate 10 is typically a glass substrate.

The TFTs 20 are supported on the substrate 10.

Each TFT 20 includes a semiconductor layer 21, gate electrodes 22, a source electrode 23, and a drain electrode 24. In the present embodiment, the TFTs 20 are top-gate type TFTs. Moreover, each TFT 20 has a so-called double gate structure, including two gates (i.e., two gate electrodes 22 are provided).

The scanning lines (also referred to as "gate bus lines") 11 are provided so as to extend substantially parallel to a certain direction (first direction). In the present embodiment, the first direction is the horizontal direction on the display surface of the liquid crystal display device. The scanning lines 11 are electrically connected to the gate electrodes 22 of the TFT 20.

The signal lines (also referred to as "source bus lines") 12 are provided so as to extend substantially parallel to a direction (second direction) which is orthogonal to the first direction. In the present embodiment, the second direction is the vertical direction of the display surface of the liquid crystal display device. The signal lines 12 are electrically connected to the source electrodes of the TFTs 20.

A basecoat layer 13 is formed on the surface of the substrate 10, such that the semiconductor layer 21 of the TFTs 20 is provided upon the basecoat layer 13. As the material of the semiconductor layer 21, various known semiconductor materials can be used; for example, amorphous silicon, polycrystalline silicon, continuous grain silicon (CGS), or the like can be used. Alternatively, an oxide semiconductor such as an In—Ga—Zn—O type semiconductor may also be used.

A gate insulating layer 14 is formed so as to cover the semiconductor layer 21, such that the scanning lines 11 and the gate electrodes 22 are provided upon the gate insulating layer 14. In other words, the gate insulating layer 14 is provided between the semiconductor layer 21 and the gate electrodes 22. In the present embodiment, the portions of the scanning lines 11 that overlap the semiconductor layer 21 function as the gate electrodes 22.

An interlayer insulating layer 15 is provided so as to cover the scanning lines 11 and the gate electrodes 22, such that the signal lines 12, the source electrodes 23, and the drain electrodes 24 are provided upon the interlayer insulating layer 15. In the gate insulating layer 14 and the interlayer insulating layer 15, contact holes 32 and 33 through which portions of the semiconductor layer 21 are exposed are formed. The former contact holes 32 allow the drain electrodes 24 to be electrically connected to the semiconductor layer 21. In the present embodiment, a drain electrode 24 achieves contact with the semiconductor layer 21 in each contact hole 32, whereby the semiconductor layer 21 and the drain electrode 24 are electrically connected to each other. The latter contact holes 33 allow the source electrodes 23 to be electrically connected to the semiconductor layer 21. In the present embodiment, a source electrode 23 achieves contact with the semiconductor layer 21 in each contact hole 33, whereby the semiconductor layer 21 and the source electrode 23 are electrically connected to each other.

As shown in FIG. 1 and FIGS. 2(a) to (c), the active matrix substrate 100A further includes an interlayer insulating layer 16, a lower layer electrode 17, a dielectric layer 18, and upper layer electrodes 19.

The interlayer insulating layer 16 is provided so as to cover the TFTs 20. More specifically, the interlayer insulating layer 16 is formed on the signal lines 12, the source electrodes 23, the drain electrodes 24, and the like.

Hereinafter, the interlayer insulating layer 16, which takes a relatively upper position, is referred to as the "first interlayer insulating layer", whereas the interlayer insulating layer 15, which takes a relatively lower position, is referred to as the "second interlayer insulating layer".

The lower layer electrode 17 is provided on the first interlayer insulating layer 16. The lower layer electrode 17 is formed continuously over all pixels. However, the lower layer electrode 17 is not formed near contact holes 31, which will be described later.

The dielectric layer 18 is provided on the lower layer electrode 17.

The upper layer electrodes 19 are provided on the dielectric layer 18. The upper layer electrodes 19 overlap at least portions of the lower layer electrode 17 via the dielectric layer 18. The upper layer electrodes 19 are formed independently (in isolated forms) for the respective pixels. In the present embodiment, an upper layer electrode 19 accounts for substantially the entirety of each pixel, thus constituting a so-called spread electrode in which no slits or apertures are formed. Moreover, the upper layer electrodes 19 are electrically connected to the drain electrodes 24 of the TFTs 20, so that display signal voltages are supplied thereto from the signal lines 11, via the TFTs 20. In other words, the upper layer electrodes 19 function as the pixel electrodes.

On the other hand, the lower layer electrode 17 has a storage capacitor voltage (Cs voltage) supplied thereto, thus functioning as a storage capacitor line and a storage capacitor electrode. In other words, the lower layer electrode 17 and upper layer electrodes 19, and the dielectric layer 18 interposed therebetween, constitute a storage capacitor. The upper layer electrodes 19 functioning as the pixel electrodes and the lower layer electrode 17 functioning as the storage capacitor electrode are each made of a transparent electrically conductive material (e.g., ITO).

In the first interlayer insulating layer 16 and the dielectric layer 18, contact holes 31 are formed, through which portions of the drain electrodes 24 are exposed. The contact holes 31 allow the upper layer electrodes 19 to be electrically connected to the drain electrodes 24. In the present embodiment, the upper layer electrodes 19 achieve contact with the drain electrode 24 in the contact hole 31, whereby the drain electrodes 24 and the upper layer electrodes 19 are electrically connected to one another.

Hereinafter, the contact hole 31 for allowing the upper layer electrodes 19 to be electrically connected to the drain electrodes 24 will be referred to as the "first contact holes". On the other hand, the contact hole 32 for allowing the drain electrodes 24 to be electrically connected to the semiconductor layer 21 will be referred to as "second contact holes", whereas the contact holes 33 for allowing the source electrodes 23 to be electrically connected to the semiconductor layer 21 will be referred to as "third contact holes".

Each first contact hole 31 includes a first aperture 16a formed in the first interlayer insulating layer 16 and a second aperture 18a formed in the dielectric layer 18. As shown in FIG. 1, a width $W1_H$ of the first aperture 16a along the horizontal direction (first direction) is smaller than a width $W2_H$ of the second aperture 18a along the horizontal direction. Moreover, a width $W1_V$ of the first aperture 16a along the vertical direction (second direction) is greater than a width $W2_V$ of the second aperture 18a along the vertical direction.

Furthermore, when viewed from the normal direction of the substrate 10, portions of the contour of the second aperture 18a are located inside the contour of the first aperture 16a. More specifically, the contour of the second aperture 18a includes two sides (an upper side and a lower side) which are substantially parallel to the horizontal direction, each being located partially inside the contour of the first aperture 16a. Thus, the contour of the second aperture 18a and the contour of the first aperture 16a intersect each other.

Figure 3:
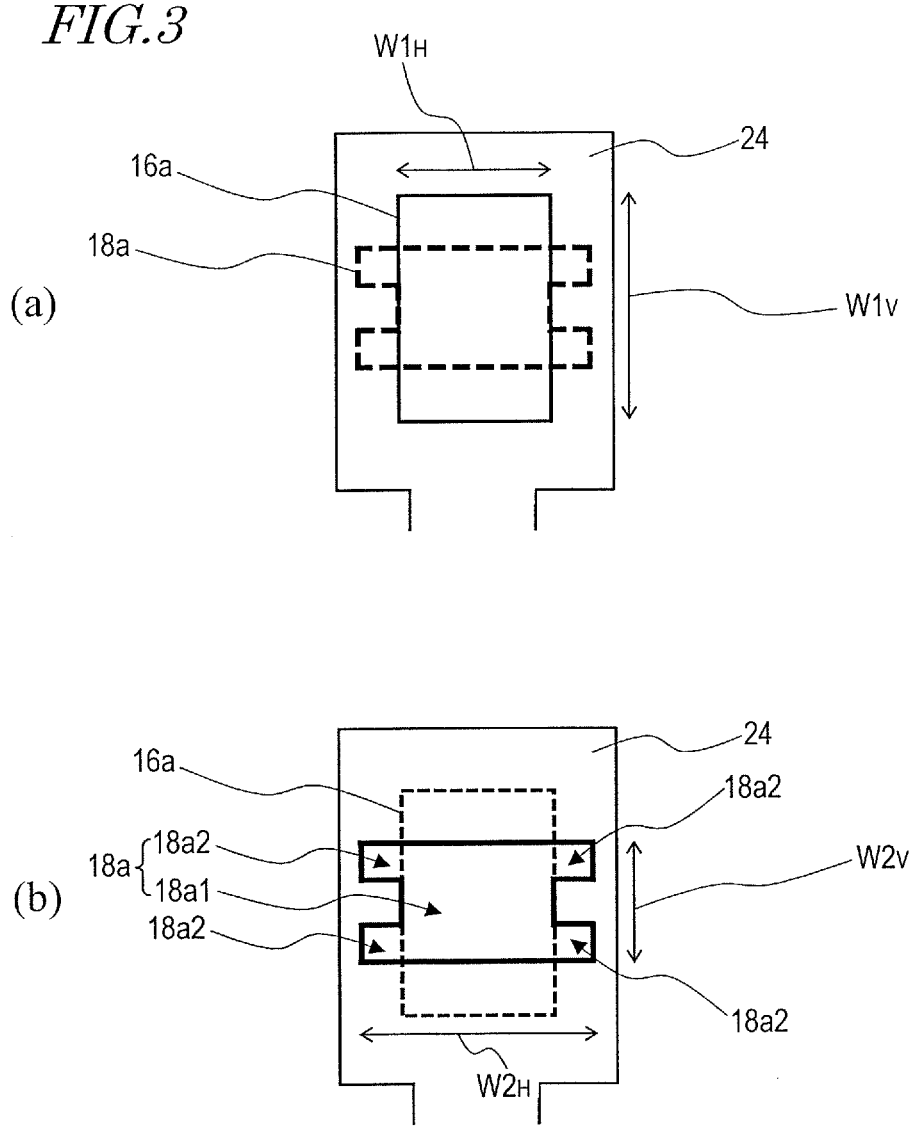
[FIG. 3] (a) and (b) are diagrams showing enlarged the neighborhood of a first aperture 16a and a second aperture 18a in the active matrix substrate 100A according to an embodiment of the present invention.

Now, with reference to FIGS. 3(a) and (b), the shapes and positioning of the first aperture 16a and the second aperture 18a will be described in more detail. FIGS. 3(a) and (b) are diagrams showing enlarged the neighborhood of the first aperture 16a and the second aperture 18a. In FIG. 3(a), the contour of the first aperture 16a is shown with a solid line, whereas the contour of the second aperture 18a is shown with a broken line. On the other hand, in FIG. 3(b), the contour of the first aperture 16a is shown with a broken line, whereas the contour of the second aperture 18a is shown with a solid line.

When viewed from the normal direction of the substrate 10, the contour of the first aperture 16a is rectangular, as shown in FIG. 3(a). On the other hand, the contour of the second aperture 18a is not rectangular, as shown in FIG. 3(b).

The second aperture 18a includes a first portion 18a1 overlapping the first aperture 16a, and a plurality of second portions 18a2 extending from the first portion 18a1 and not overlapping the first aperture 16a. In the present embodiment, the second aperture 18a includes four second portions 18a2. Two of the four second portions 18a2 are located on one side (left-hand side) of the first portion 18a1 along the horizontal direction (first direction), whereas the other two are located on the other side (right-hand side). More specifically, the former two second portions 18a2 extend from the upper left and from the lower left of the first portion 18a1, whereas the latter two second portions 18a2 extend from the upper right and from the lower right of the first portion 18a1.

Thus, the contour of the second aperture 18a is H-shaped. Therefore, it can be said that the second aperture 18a is formed so that the area of the portions of the second aperture 18a not overlapping the first aperture 16a is smaller than that in an imaginary case where the contour of the second aperture 18a is a rectangle whose width along the horizontal direction (first direction) and width along the vertical direction (second direction) are identical to those of the contour of the second aperture 18a.

Because of the aforementioned shapes and positioning of the first aperture 16a in the first interlayer insulating layer 16 and the second aperture 18a in the dielectric layer 18, the active matrix substrate 100A of the present embodiment improves the definition up to which manufacture is possible, so that manufacture at a high definition than conventional is possible. Hereinafter, the reasons therefor will be described with reference to Comparative Example.

Figure 4:
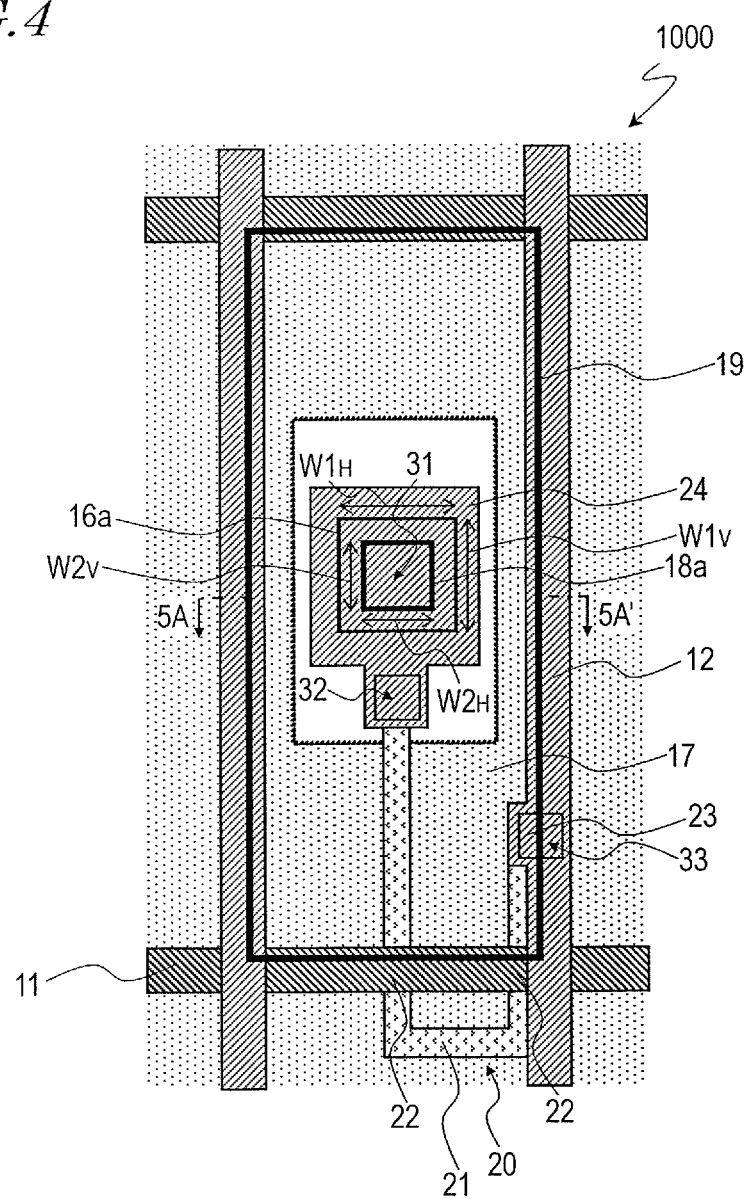
[FIG. 4] A diagram schematically showing an active matrix substrate 1000 according to Comparative Example 1, as a plan view showing a region corresponding to one pixel.
Figure 5:
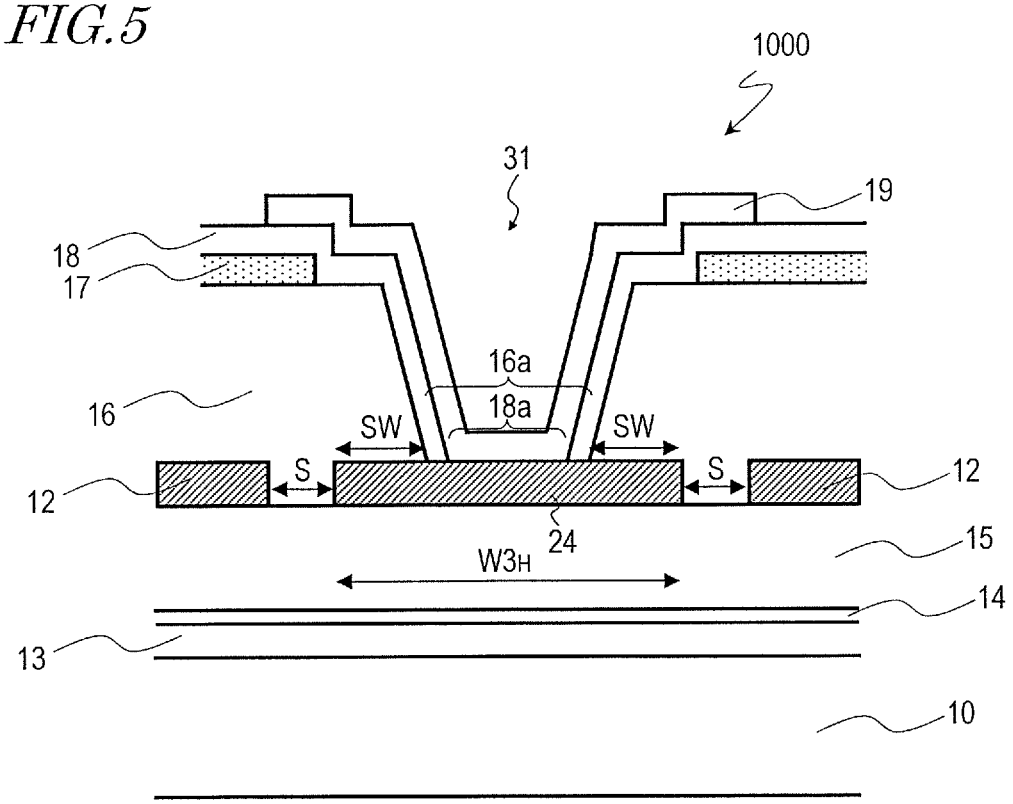
[FIG. 5] A diagram schematically showing the active matrix substrate 1000 according to Comparative Example 1, as a cross-sectional view taken along line 5A-5A' in FIG. 4.

FIG. 4 and FIG. 5 show an active matrix substrate 1000 according to Comparative Example 1. FIG. 4 is a plan view schematically showing the active matrix substrate 1000, and FIG. 5 is a cross-sectional view taken along line 5A-5A' in FIG. 4.

In the active matrix substrate 1000 according to Comparative Example 1, the shapes and positioning of the first aperture 16a in the first interlayer insulating layer 16 and the second aperture 18a in the dielectric layer 18 are different from the shapes and positioning of the first aperture 16a and the second aperture 18a of the active matrix substrate 100A of the present embodiment.

In the active matrix substrate 1000, in order to avoid insufficient connection arising from stepping of the upper layer electrodes 19, as shown in FIG. 4 and FIG. 5, the second aperture 18a in the dielectric layer 18 is formed so that its entirety is located within the first aperture 16a in the first interlayer insulating layer 16 when viewed from the normal direction of the substrate 10. In other words, the entire contour of the second aperture 18a is located inside the contour of the first aperture 16a. Therefore, not only is the width $W1_v$ of the first aperture 16a along the vertical direction (second direction) greater than the width $W2_v$ of the second aperture 18a along the vertical direction, but also the width $W1_H$ of the first aperture 16a along the horizontal direction (first direction) is greater than the width $W2_H$ of the second aperture 18a along the horizontal direction.

Therefore, in order to shade the neighborhood of the tapered portion of the first aperture 16a across an appropriate light-shielding width (i.e., the distance from the contour of the first aperture 16a to the outer edge of the drain electrode 24) SW, it is necessary to also increase the width $W3_H$ of the drain electrode 24 along the horizontal direction. Therefore, in the case where a standard pixel construction with a 1:3 ratio (H/V ratio) between the pixel pitch along the horizontal direction and the pixel pitch along the vertical direction is adopted, it becomes no longer possible to sufficiently secure intralayer spaces S along the horizontal direction as the definition increases. Therefore, the active matrix substrate 1000 according to Comparative Example 1 is limited with respect to definition, such that manufacture at a high definition is difficult. Specifically, manufacture at a pixel density of 370 ppi or above becomes difficult.

On the other hand, in the active matrix substrate 100A of the present embodiment, the width $W1_H$ of the first aperture 16a along the horizontal direction (first direction) is smaller than the width $W2_H$ of the second aperture 18a along the horizontal direction. Therefore, while securing the same light-shielding width SW as conventionally (i.e., without a decrease in the contrast ratio caused by disorderly alignment), the width $W3_H$ of the drain electrode 24 along the horizontal direction can be reduced. This makes it possible to secure sufficient intralayer spaces S, such that the definition up to which manufacture is possible (i.e., an upper limit value below which leak defects within the same layer would not be increased) can be increased. Specifically, manufacture is sufficiently possible even when the pixel density is increased to about 450 ppi.

Note that, in a cross section where the first aperture 16a has a smaller width than the width of the second aperture 18a (i.e., a cross section shown in FIG. 2(a) where $W1_H<W2_H$), the upper layer electrodes 19 may experience stepping due to the side face shape of the first contact hole 31 becoming steep. However, in the active matrix substrate 100A of the present embodiment, portions of the contour of the second aperture 18a are located inside the contour of the first aperture 16a, whereby stepping of the upper layer electrodes 19 is suppressed in a cross section where the contour of the second aperture 18a is located inside the contour of the first aperture 16a (i.e., a cross section shown in FIG. 2(c)). In FIG. 2(c), the left side face shape and the right side face shape of the first contact hole 31 are the same as those of the active matrix substrate 1000 according to Comparative Example 1. Therefore, beginning from these portions (the portions of the contour of the second aperture 18a that are located inside the contour of the first aperture 16a ; which herein are part of the upper side and the lower side of the contour of the second aperture 18a), a sufficient area of contact between each upper layer electrode 19 and each drain electrode 24 can be guaranteed (i.e., equivalent to that of Comparative Example 1 or even higher), thereby realizing an interconnection resistance which is equivalent to or higher than that of Comparative Example 1.

Thus, the active matrix substrate 100A of the present embodiment improves the definition up to which manufacture is possible, while securing a performance and an interconnection resistance equivalent to those of the active matrix substrate 1000 according to Comparative Example 1. Moreover, when compared at the same pixel pitch (i.e., the same definition), the intralayer spaces S are increased in the active matrix substrate 100A of the present embodiment, so that leak defects within the same layer can be reduced, and the production yield can be improved.

Furthermore, in the active matrix substrate 100A of the present embodiment, the upper layer electrodes 19 and the lower layer electrode 17 composing storage capacitors are each made of a transparent electrically conductive material, so that sufficient storage capacitances can be secured without allowing the aperture ratio to decrease. Moreover, since the lower layer electrode 17 permits the upper layer electrodes 19 functioning as pixel electrodes to be electrically shielded from the scanning lines 11 and the signal lines 12, capacitance (parasitic capacitance) is prevented from being generated between the upper layer electrodes 19 and the scanning lines 11 or the signal lines 12. This decreases the load on the scanning lines 11 and the signal lines 12, and enables reduced power consumption.

Figure 6:
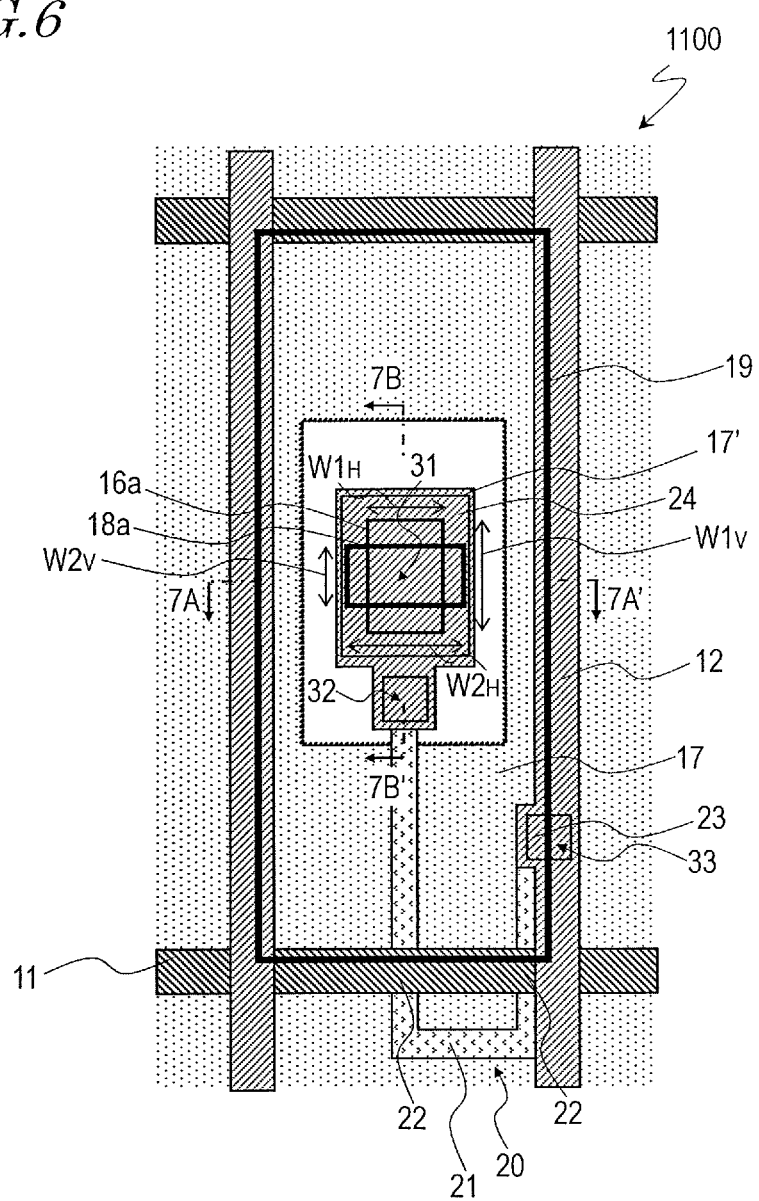
[FIG. 6] A diagram schematically showing an active matrix substrate 1100 according to Comparative Example 2, as a plan view showing a region corresponding to one pixel.

Note that the aforementioned effect of improving the definition up to which manufacture is possible can also be obtained with the active matrix substrate 1100 of Comparative Example 2 shown in FIG. 6 and FIG. 7. The active matrix substrate 1100 of Comparative Example 2 differs from the active matrix substrate 100A of the present embodiment in that the contour of the second aperture 18a is rectangular.

Therefore, when the width $W2_H$ of the second aperture 18a along the horizontal direction and the width $W2v$ along the vertical direction in the active matrix substrate 1100 of Comparative Example 2 are equal to the width $W2_H$ of the second aperture 18a along the horizontal direction and the width W2v along the vertical direction in the active matrix substrate 100A of the present embodiment, the area of the portions of the second aperture 18a in the active matrix substrate 100A of the present embodiment that do not overlap the first aperture 16a is smaller than the area of the portions of the second aperture 18a that do not overlap the first aperture 16a in the active matrix substrate 1100 of Comparative Example 2.

In the active matrix substrate 1100 of Comparative Example 2, too, the width $W1_H$ of the first aperture 16a along the horizontal direction is smaller than the width $W2_H$ of the second aperture 18a along the horizontal direction. Moreover, when viewed from the normal direction of the substrate 10, portions of the contour of the second aperture 18a are located inside the contour of the first aperture 16a. Thus, the active matrix substrate 1100 of Comparative Example 2 also improves the definition up to which manufacture is possible, for the same reasons as those described with respect to the active matrix substrate 100A of the present embodiment.

However, in the active matrix substrate 1100 of Comparative Example 2, when forming the second aperture 18a in the dielectric layer 18 (which is made of e.g. SiNx) via dry etching, the surface of the first interlayer insulating layer 16 (which is made of e.g. a photosensitive resin) is also etched, thus disturbing the alignment of liquid crystal molecules in the etched regions. Furthermore, if such regions are not adequately shaded by the drain electrode 24 due to an etching shift of the drain electrode 24 and the dielectric layer 18, leakage of light will occur.

Figure 8:
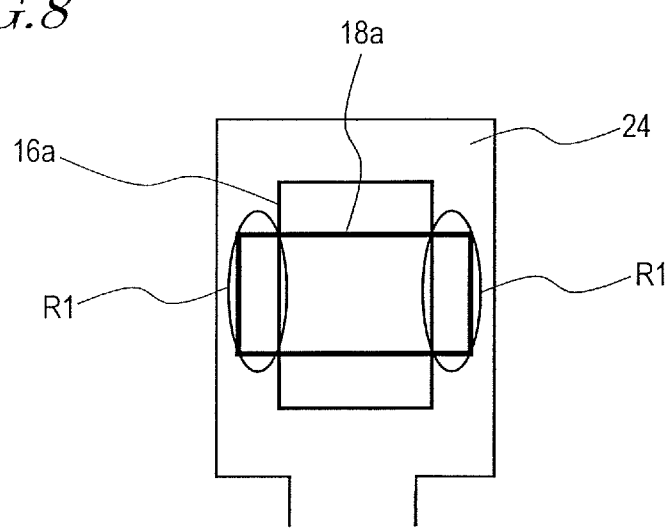
[FIG. 8] A diagram showing regions R1 where leakage of light may occur in the active matrix substrate 1100 according to Comparative Example 2.

FIG. 8 shows regions R1 in which leakage of light can occur for the aforementioned reason. As shown in FIG. 8, the portions of the second aperture 18a that do not overlap the first aperture 16a are regions R1 in which leakage of light may occur. Leakage of light will be a cause for degraded display quality.

On the other hand, in the active matrix substrate 100A of the present embodiment, the area of the portions of the second aperture 18a not overlapping the first aperture 16a is smaller than that of the active matrix substrate 1100 of Comparative Example 2. This reduces the area of the regions of the surface of the first interlayer insulating layer 16 which are etched when forming the second aperture 18a in the dielectric layer 18. As a result, degradation of display quality due to disorderly alignment and leakage of light is suppressed.

If the second aperture 18a did not have the second portions 18a2 not overlapping the first aperture 16a (i.e., if it only had the first portion 18a1), the area of the regions that end up being etched would be even smaller. However, for reasons mentioned below, it is preferable that the second aperture 18a includes the second portions 18a2.

Figure 9:
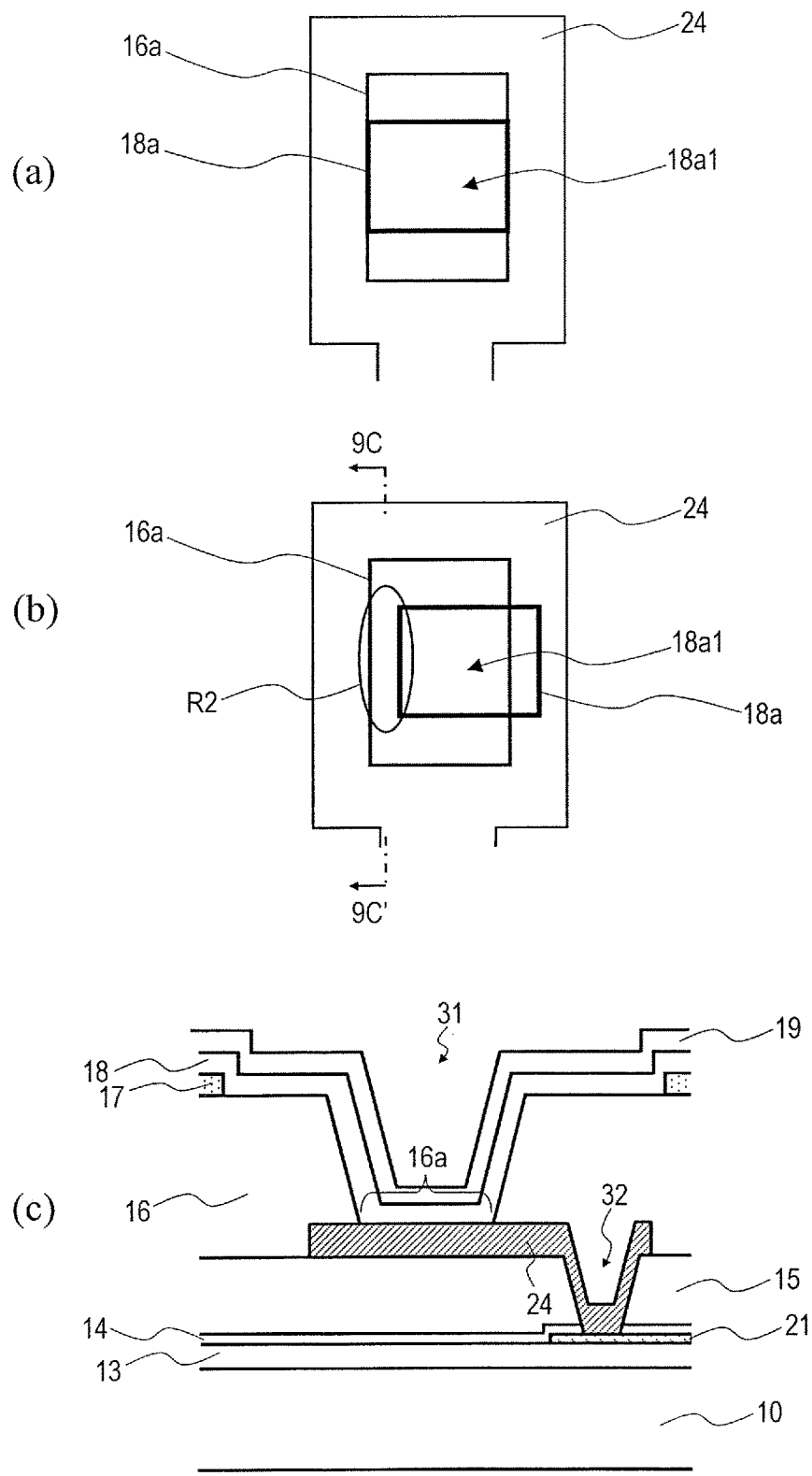
[FIG. 9] (a) is a diagram showing a second aperture 18a only having a first portion 18a1; (b) is a diagram showing the second aperture 18a shown in (a) being deviated from the intended position due to misalignment; and (c) is a diagram (a cross-sectional view taken along line 9C-9C' in (b)) showing a cross-sectional structure of a region R2 in which the second aperture 18a no longer overlaps the first aperture 16a due to such deviation.

Consider a case, as shown in FIG. 9(a), where the second aperture 18a only includes the first portion 18a1, without including the second portions 18a2. As shown in FIG. 9(b), the second aperture 18a and the drain electrode 24 as such may deviate from their intended relative positioning due to misalignment. In the example shown in FIG. 9(b), the second aperture 18a is deviated toward the right from the intended position. In a region R2 in which the second aperture 18a no longer overlaps the first aperture 16a due to such deviation, as shown in FIG. 9(c), the upper electrode 19 is not in contact with the drain electrode 24, resulting in a significantly reduced area of contact.

On the other hand, in the active matrix substrate 100A of the present embodiment, in which the second aperture 18a includes the second portions 18a2 not overlapping the first aperture 16a, the presence of the second portions 18a2 reduces the decrease in the area of contact even under misalignment, as shown in FIGS. 10(a) and (b). Moreover, as can be seen from FIGS. 10(a) and (b), at least one (e.g., two) second portion 18a2 among the plurality of (e.g., four) second portions 18a2 is located on one side of the first portion 18a1 along the horizontal direction, while at least another (e.g., the other two) second portion 18a2 is located on the other side. Thus, the decrease in the area of contact can be reduced even when the second aperture 18a deviates toward either side along the horizontal direction.

Next, with reference to FIG. 11 to FIG. 14, an exemplary method for producing the active matrix substrate 100A of the present embodiment will be described. FIG. 11 to FIG. 14 are step-by-step cross-sectional views for describing the method for producing the active matrix substrate 100A. (a1) to (a3) of FIG. 11 and (a1) and (a2) of FIG. 12 to FIG. 14 correspond to a cross section taken along line 2A-2A' in FIG. 1. Moreover, (b1) to (b3) of FIG. 11 and (b1) and (b2) of FIG. 12 to FIG. 14 correspond to a cross section taken along line 2B-2B' in FIG. 1, whereas (c1) to (c3) of FIG. 11 and (c1) and (c2) of FIG. 12 to FIG. 14 correspond to a cross section taken along line 2C-2C' in FIG. 1.

Figure 11:
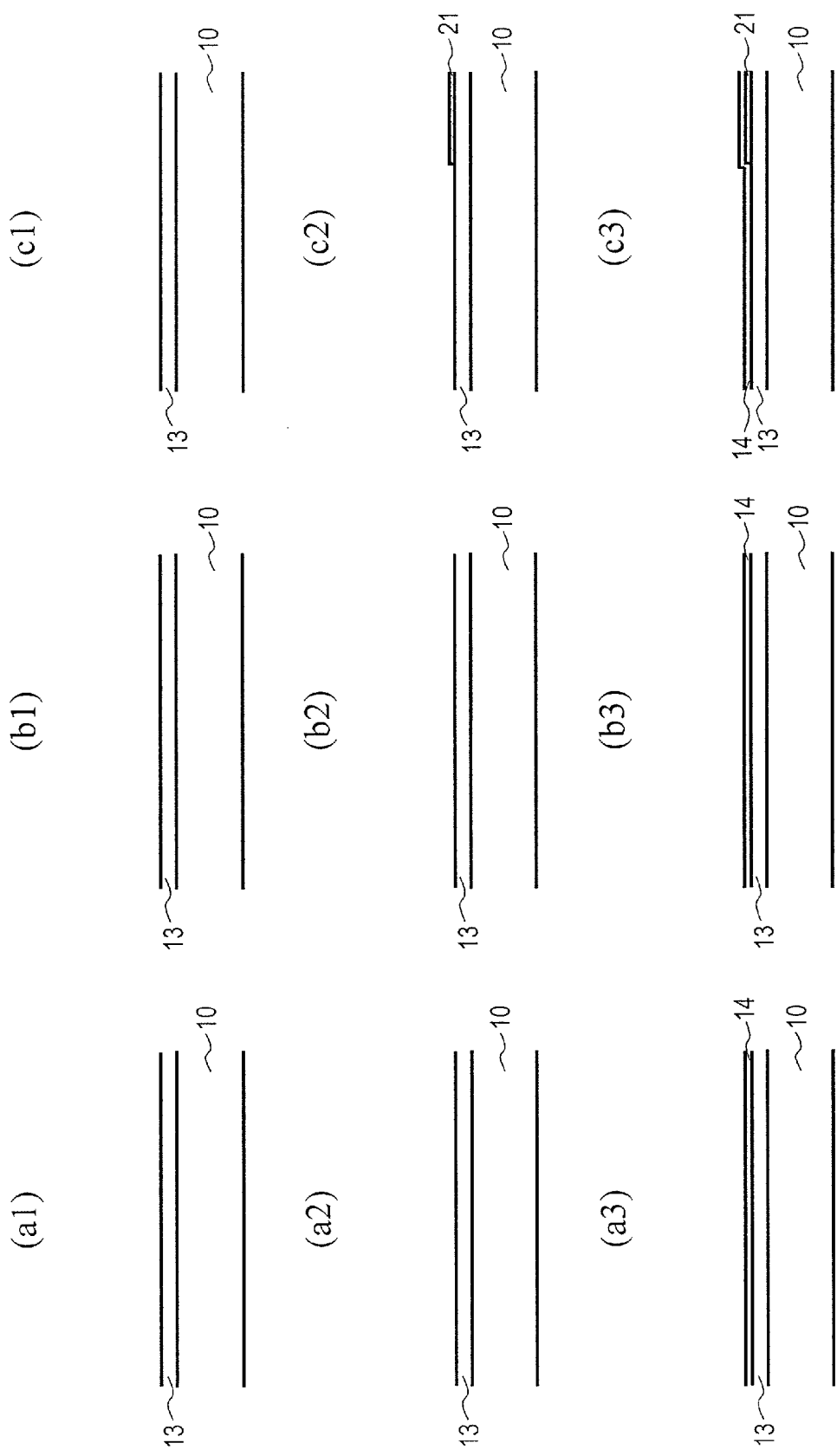
[FIG. 11] Step-by-step cross-sectional views showing a method of producing the active matrix substrate 100A according to an embodiment of the present invention, where (a1) to (a3) correspond to a cross section taken along line 2A-2A' in FIG. 1; (b1) to (b3) correspond to a cross section taken along line 2B-2B' in FIG. 1; and (c1) to (c3) correspond to a cross section taken along line 2C-2C' in FIG. 1.

First, as shown in FIG. 11 (a1), (b1), and (c1), a basecoat layer 13 is formed on a substrate 10. For example, a glass substrate is used as the substrate 10, and, as the basecoat layer 13, a multilayer film ($SiO_2$/SiON film) of an SiON film (lower layer) with a thickness of 50 nm to 100 nm and an $SiO_2$ film (upper layer) with a thickness of 50 nm to 200 nm is formed by CVD technique on the surface of this glass substrate.

Next, as shown in FIG. 11 (a2), (b2), and (c2), a semiconductor layer 21 is formed on the basecoat layer 13. For example, by a known technique, a polycrystalline silicon (poly-Si) layer is formed in island shapes as the semiconductor layer 21, with a thickness of 30 nm to 60 nm.

Then, as shown in FIG. 11 (a3), (b3), and (c3), a gate insulating layer 14 covering the semiconductor layer 21 is formed. For example, by CVD technique, an $SiO_2$ film with a thickness of 50 nm to 100 nm is formed as the gate insulating layer 14. Thereafter, although not shown herein, scanning lines 11 and gate electrodes 22 are formed on the gate insulating layer 14. For example, by sputtering technique, a multilayer film of a TaN film (lower layer) with a thickness of 30 nm to 50 nm and a W film (upper layer) with a thickness of 300 nm to 400 nm is deposited, and this multilayer film (W/TaN film) is patterned by photolithography technique to form the scanning lines 11 and the gate electrodes 22.

Figure 12:
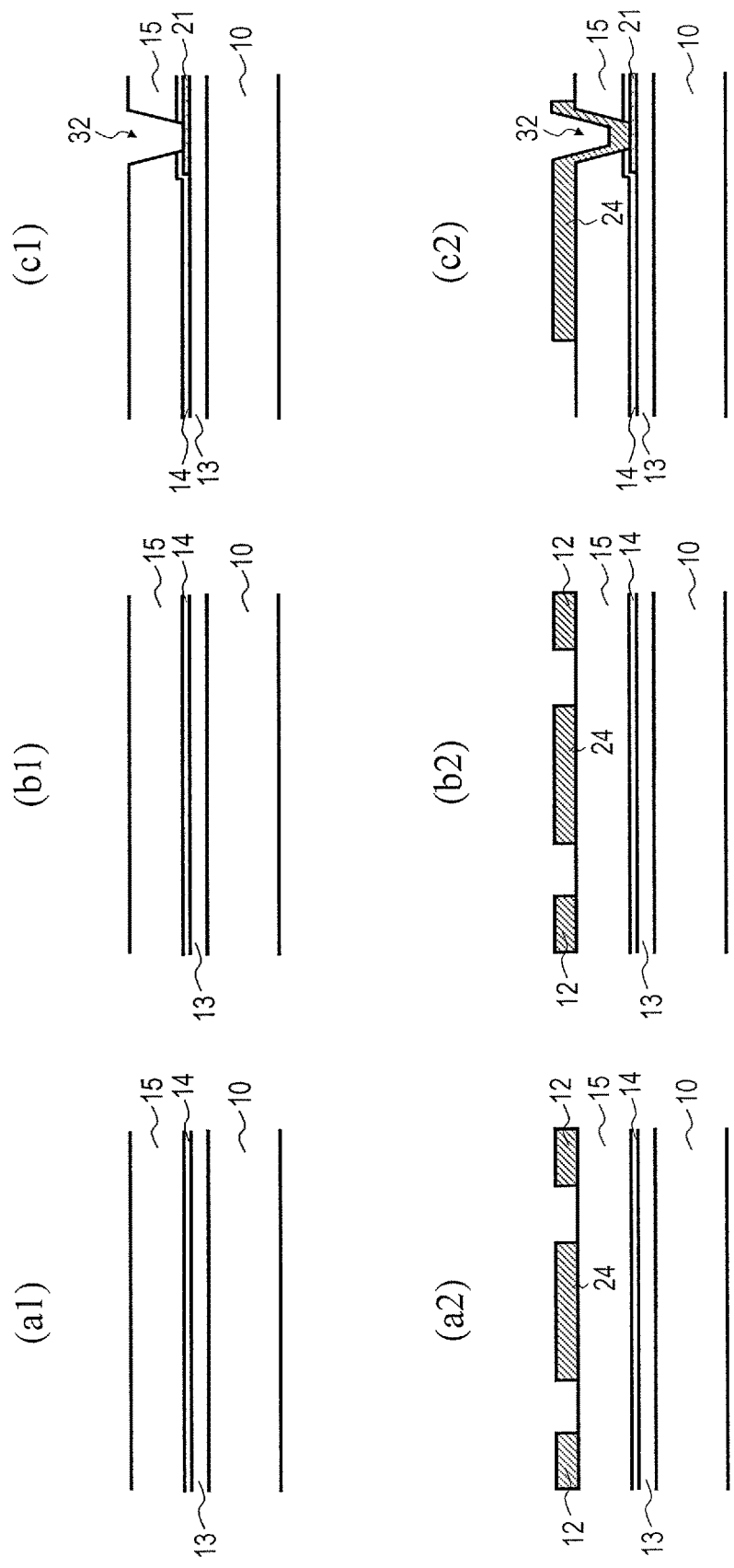
[FIG. 12] Step-by-step cross-sectional views showing a method of producing the active matrix substrate 100A according to an embodiment of the present invention, where (a1) and (a2) correspond to a cross section taken along line 2A-2A' n FIG. 1; (b1) and (b2) correspond to a cross section taken along line 2B-2B' in FIG. 1; and (c1) and (c2) correspond to a cross section taken along line 2C-2C' in FIG. 1.

Next, as shown in FIG. 12 (a1), (b1), and (c1), a second interlayer insulating layer 15 covering the scanning lines 11 and the gate electrodes 22 is formed. For example, by CVD technique, a multilayer film ($SiO_2$/SiNx film) of a SiNx film (lower layer) with a thickness of 100 nm to 300 nm and an $SiO_2$ film (upper layer) with a thickness of 400 nm to 700 nm is formed as the second interlayer insulating layer 15. Thereafter, via etching, a second contact hole 32 and a third contact hole 33 (not shown herein) through which to expose portions of the semiconductor layer 21 are formed in the gate insulating layer 14 and in the second interlayer insulating layer 15.

Then, as shown in FIG. 12 (a2), (b2), and (c2), signal lines 12, source electrodes 23 (not shown herein) and drain electrodes 24 are formed on the second interlayer insulating layer 15. For example, by sputtering technique, a multilayer film of a Ti film (lower layer) with a thickness of 30 nm to 50 nm, an Al layer (intermediate layer) with a thickness of 300 nm to 500 nm, and a Ti film (upper layer) with a thickness of 30 nm to 50 nm is deposited, and this multilayer film (Ti/Al/Ti film) is patterned by photolithography technique to form the signal lines 12, the source electrodes 23, and the drain electrodes 24. In this manner, the TFTs 20 can be formed on the substrate 10.

Next, as shown in FIG. 13 ($a1$), ($b1$), and ($c1$), a first interlayer insulating layer 16 covering the TFT 20 and having first apertures 16$a$ is formed. Preferably, the first interlayer insulating layer 16 includes a layer of an organic material such as a resin. For example, the first interlayer insulating layer 16 having the first apertures 16$a$ may be formed by using a positive-type photosensitive resin film with a thickness of 2 µm to 3 µm as the first interlayer insulating layer 16.

Then, as shown in FIG. 13 ($a2$), ($b2$), and ($c2$), a lower layer electrode (functioning as a storage capacitor line and a storage capacitor electrode) 17 is formed on the first interlayer insulating layer 16. For example, by sputtering technique, an ITO film with a thickness of 50 nm to 200 nm is formed as the lower layer electrode 17. Note that the electrically conductive film of the lower layer electrode 17 is removed near the regions to later become first contact holes 31 (i.e., near the first apertures 16$a$).

Figure 14:
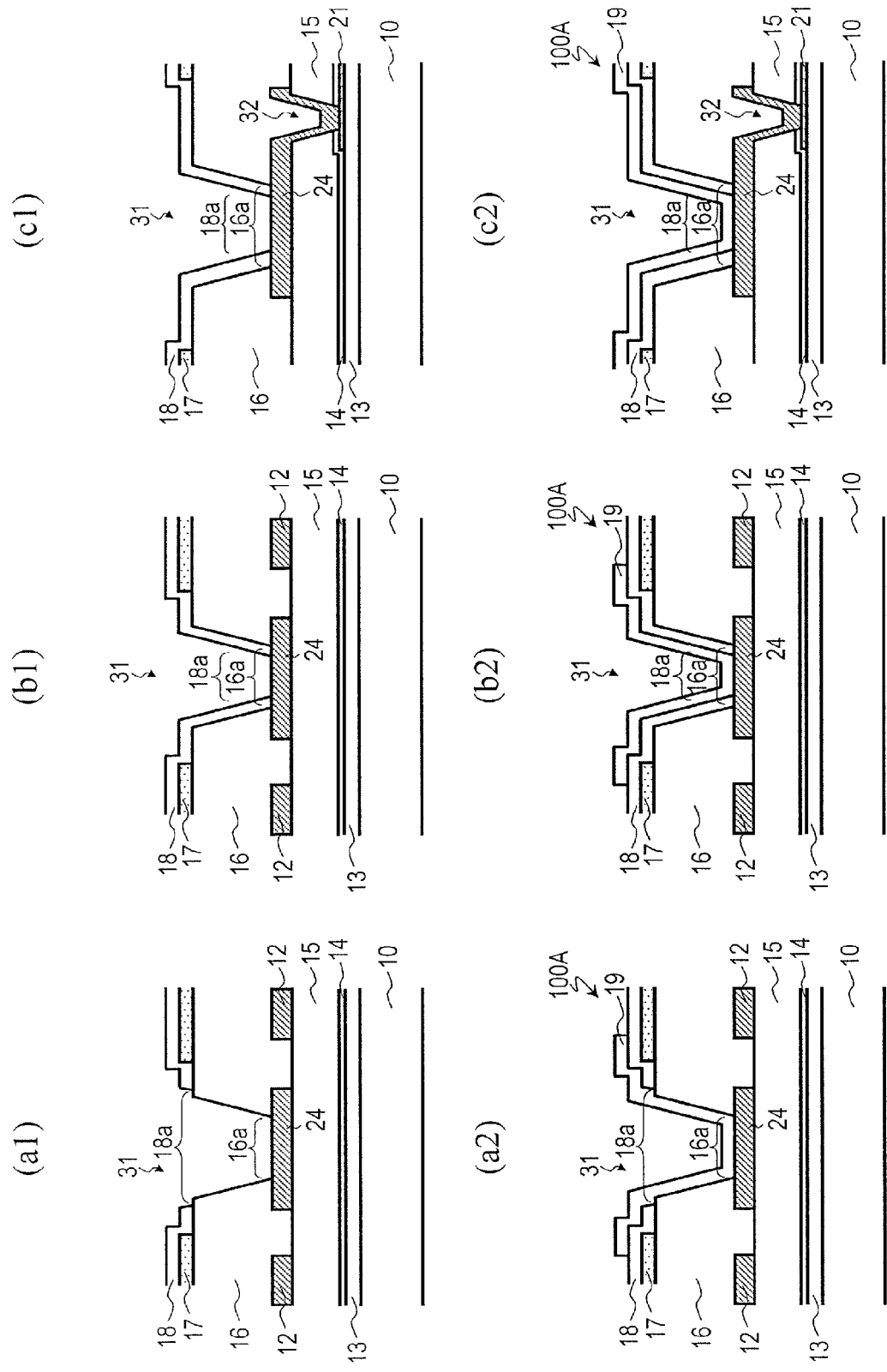
[FIG. 14] Step-by-step cross-sectional views showing a method of producing the active matrix substrate 100A according to an embodiment of the present invention, where (a1) and (a2) correspond to a cross section taken along line 2A-2A' n FIG. 1; (b1) and (b2) correspond to a cross section taken along line 2B-2B' in FIG. 1; and (c1) and (c2) correspond to a cross section taken along line 2C-2C' in FIG. 1.

Next, as shown in FIG. 14 ($a1$), ($b1$), and ($c1$), a dielectric layer 18 having second apertures 18$a$ is formed on the lower layer electrode 17. For example, by CVD technique, an SiNx film with a thickness of 100 nm to 300 nm is deposited, and second apertures 18$a$ are formed in this SiNx film via etching, thus forming the dielectric layer 18.

Thereafter, as shown in FIG. 14 ($a2$), ($b2$), and ($c2$), on the dielectric layer 18, upper layer electrodes (functioning as pixel electrodes) 19 which overlap at least portions of the lower layer electrode 17 via the dielectric layer 18 are formed. For example, an ITO film with a thickness of 50 nm to 200 nm is deposited by sputtering technique, and this ITO film is patterned by photolithography technique to form the upper layer electrodes 19. Each upper layer electrode 19 is electrically connected to a drain electrode 24 in a first contact hole 31, which includes the first aperture 16$a$ in the first interlayer insulating layer 16 and the second aperture 18$a$ in the dielectric layer 18.

The step of forming the first interlayer insulating layer 16 and the step of forming the dielectric layer 18 are conducted in such a manner that the width $W1_H$ of the first aperture 16$a$ along the horizontal direction (first direction) is smaller than the width $W2_H$ of the second aperture 18$a$ along the horizontal direction. Moreover, these two steps are conducted in such a manner that, when viewed from the normal direction of the substrate 10, portions of the contour of the second aperture 18$a$ are located inside the contour of the first aperture 16$a$.

Furthermore, these two steps are conducted so that, when viewed from the normal direction of the substrate 10, the contour of the second aperture 18$a$ is not a rectangular, such that the area of the portions of the second aperture 18$a$ not overlapping the first aperture 16$a$ is smaller than that in an imaginary case where the contour of the second aperture 18$a$ is a rectangle whose width along the horizontal direction (first direction) and whose width along the vertical direction (second direction) are identical to those of the contour of the second aperture 18$a$.

In this manner, the active matrix substrate 100A of the present embodiment can be produced.

Although the present embodiment illustrates an exemplary case where the width $W1_H$ of the first aperture 16$a$ along the horizontal direction (first direction) is smaller than the width $W2_H$ of the second aperture 18$a$ along the horizontal direction, the present invention is not limited thereto. In the case where the drain electrodes 24 are made of the same electrically conductive film as the signal lines 12, which is the case with the present embodiment, it is preferable that the width $W1_H$ of the first aperture 16$a$ along the horizontal direction is smaller than the width $W2_H$ of the second aperture 18$a$ along the horizontal direction, in order to ensure sufficient intralayer spaces along the horizontal direction. In the case of ensuring sufficient intralayer spaces along the vertical direction, the width of the first aperture 16$a$ along the vertical direction (second direction) is made smaller than the width of the second aperture 18$a$ along the vertical direction. In other words, a construction in which the first aperture 16$a$ and the second aperture 18$a$ shown in FIG. 1 are rotated by 90° may be adopted.

Moreover, although the present embodiment illustrates a pixel structure for a liquid crystal display device of the VA mode, the present invention can be suitably used as a pixel structure for liquid crystal display devices of other display modes, e.g., a pixel structure for a liquid crystal display device of the FFS mode. A liquid crystal display device of the VA mode includes a vertical-alignment type liquid crystal layer, whereas a liquid crystal display device of the FFS mode includes a horizontal-alignment type liquid crystal layer. Moreover, there are no constraints as to the position of the drain electrode 24 within a pixel. Without being limited to near the center of the pixel as is illustrated in FIG. 1 and the like, any optimum position as adapted to the pixel structure (electrode structure) for each given display mode may be used.

(Embodiment 2)

Figure 15:
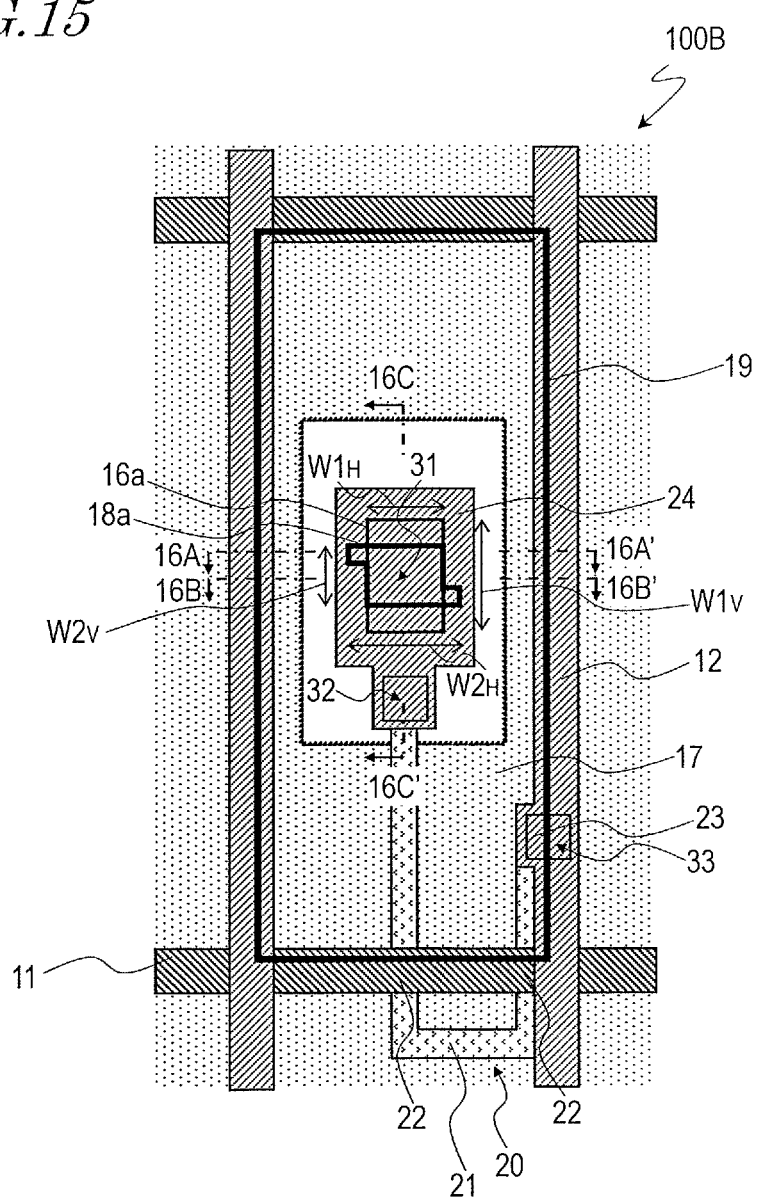
[FIG. 15] A diagram schematically showing an active matrix substrate 100B according to an embodiment of the present invention, as a plan view showing a region corresponding to one pixel.
Figure 16:
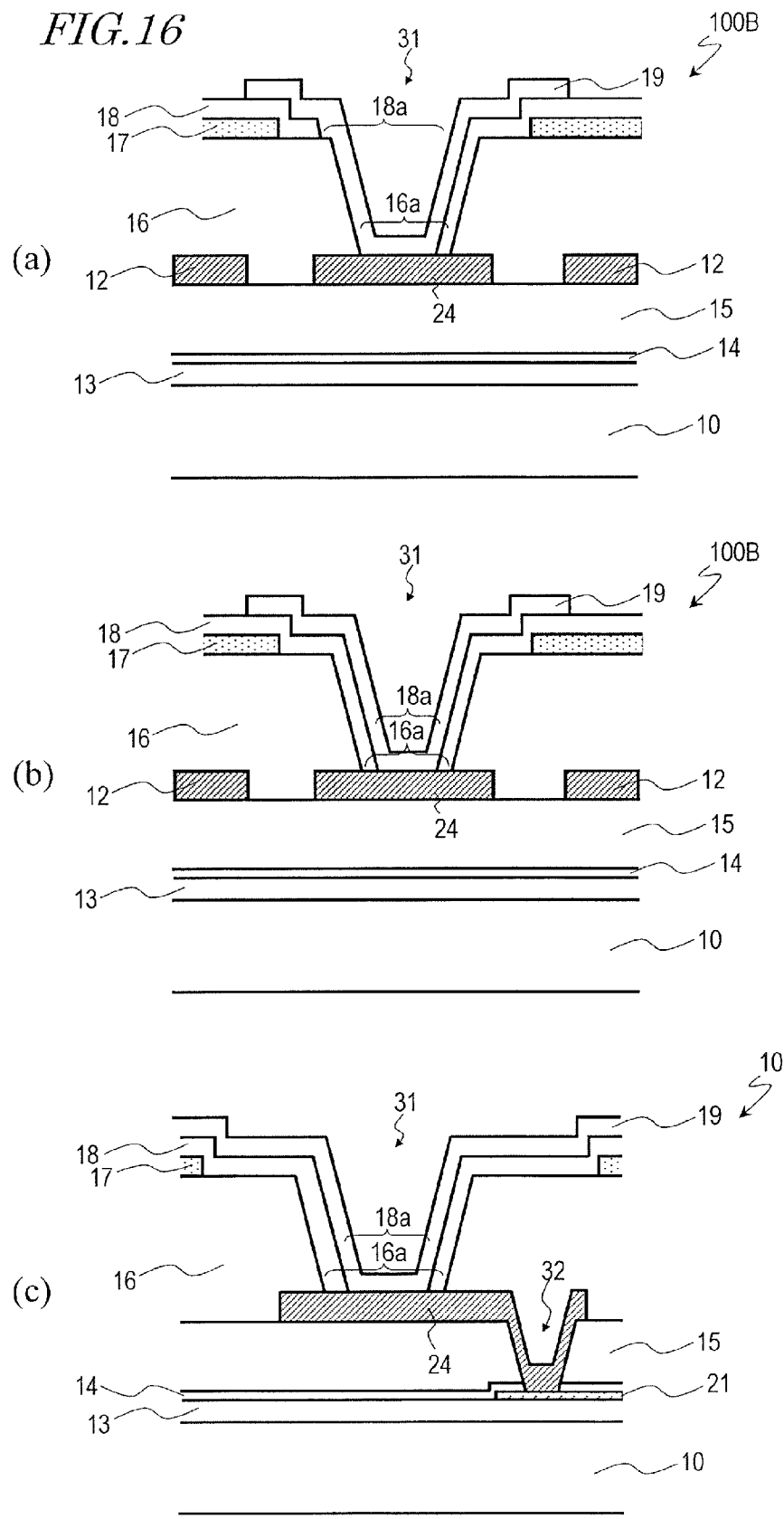
[FIG. 16] A diagram schematically showing the active matrix substrate 100B according to an embodiment of the present invention, where (a), (b), and (c) are cross-sectional views taken along line 16A-16A', line 16B-16B', and line 16C-16C' in FIG. 15, respectively.

FIG. 15 and FIG. 16 show an active matrix substrate 100B according to the present embodiment. FIG. 15 is a plan view schematically showing the active matrix substrate 100B. FIGS. 16($a$), ($b$), and ($c$) are cross-sectional views taken along line 16A-16A', line 16B-16B', and line 16C-16C' in FIG. 15, respectively.

In the active matrix substrate 100B, similarly to the active matrix substrate 100A of Embodiment 1, the width $W1_H$ of the first aperture 16$a$ along the horizontal direction (first direction) is smaller than the width $W2_H$ of the second aperture 18$a$ along the horizontal direction. Moreover, when viewed from the normal direction of the substrate 10, portions of the contour of the second aperture 18$a$ are located inside the contour of the first aperture 16$a$. Therefore, while securing a performance and an interconnection resistance equivalent to those of the active matrix substrate 1000 of Comparative Example 1, the definition up to which manufacture is possible is improved.

In the active matrix substrate 100B, too, similarly to the active matrix substrate 100A of Embodiment 1, the contour of the second aperture 18$a$ is not rectangular. However, the shape of the second aperture 18$a$ of the active matrix substrate 100B is different from the shape of the second aperture 18$a$ of the active matrix substrate 100A of Embodiment 1.

Figure 17:
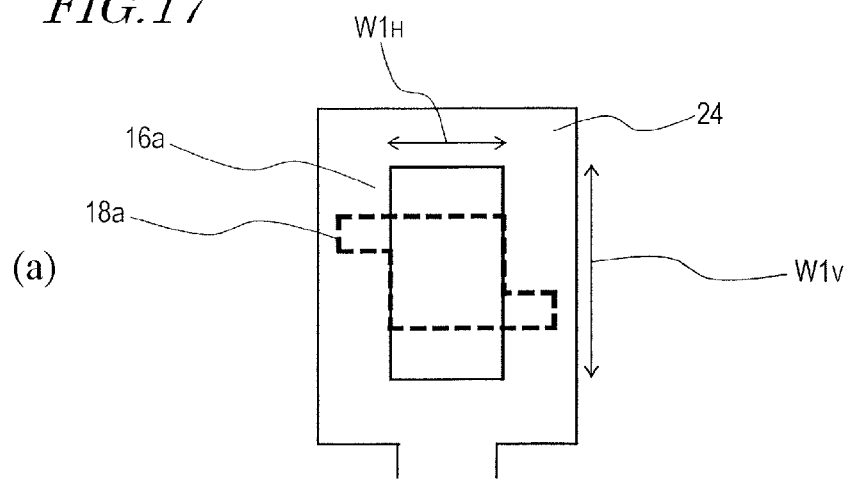
[FIG. 17] (a) and (b) are diagrams showing enlarged the neighborhood of a first aperture 16a and a second aperture 18a in the active matrix substrate 100B according to an embodiment of the present invention.

Now, with reference to FIGS. 17($a$) and ($b$), the shapes and positioning of the first aperture 16$a$ and the second aperture 18$a$ will be described in more detail. FIGS. 17($a$) and ($b$) are diagrams showing enlarged the neighborhood of the first aperture 16$a$ and the second aperture 18$a$. In FIG. 17($a$), the contour of the first aperture 16$a$ is shown with a solid line, whereas the contour of the second aperture 18$a$ is shown with a broken line. On the other hand, in FIG. 17(b), the contour of the first aperture 16a is shown with a broken line, whereas the contour of the second aperture 18a is shown with a solid line.

When viewed from the normal direction of the substrate 10, the contour of the first aperture 16a is rectangular, as shown in FIG. 17(a). On the other hand, the contour of the second aperture 18a is not rectangular, as shown in FIG. 17(b).

The second aperture 18a includes a first portion 18a1 overlapping the first aperture 16a, and a plurality of second portions 18a2 extending from the first portion 18a1 and not overlapping the first aperture 16a. Whereas the second aperture 18a of the active matrix substrate 100A of Embodiment 1 includes four second portions 18a2, the second aperture 18a of the active matrix substrate 100B of the present embodiment includes two second portions 18a2.

One of the two second portions 18a2 is located on one side (left-hand side) of the first portion 18a1 along the horizontal direction (first direction), while the other is located on the other side (right-hand side). More specifically, the former second portion 18a2 extends from the upper left of the first portion 18a1, whereas the latter second portion 18a2 extends from the lower right of the first portion 18a1.

Therefore, it can be said that the second aperture 18a is formed so that the area of the portions of the second aperture 18a not overlapping the first aperture 16a is smaller than that in an imaginary case where the contour of the second aperture 18a is a rectangle whose width along the horizontal direction (first direction) and width along the vertical direction (second direction) are identical to those of the contour of the second aperture 18a. Moreover, in the active matrix substrate 100B of the present embodiment, the second aperture 18a includes two second portions 18a2. Therefore, the region of the surface of the first interlayer insulating layer 16 that ends up being etched when forming the second aperture 18a in the dielectric layer 18 is further reduced in area, as compared to the active matrix substrate 100 of Embodiment 1 where the second aperture 18a includes four second portions 18a2. As a result, degradation of display quality due to disorderly alignment and leakage of light is further suppressed.

One of the two second portions 18a2 is located on one side of the first portion 18a1 along the horizontal direction, while the other second portion 18a2 is located on the other side. Thus, the decrease in the area of contact can be reduced even when the second aperture 18a deviates toward either side along the horizontal direction.

Figure 18:
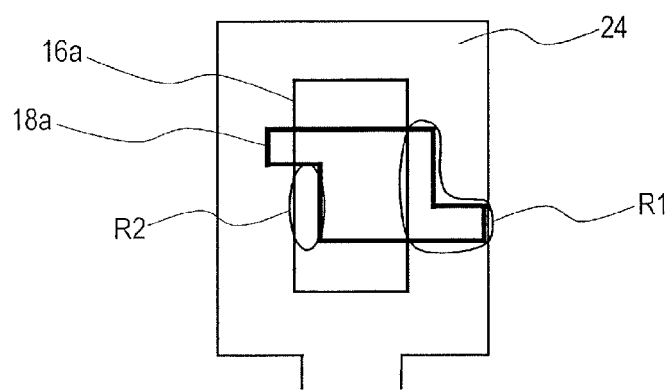
[FIG. 18] A diagram showing in the active matrix substrate 100B according to an embodiment of the present invention, the second aperture 18a and a drain electrode 24 being deviated from their intended relative positioning due to misalignment.

FIG. 18 shows the second aperture 18a and the drain electrode 24 being deviated from their intended relative positioning due to misalignment. FIG. 18 also shows a region R2 in which the second aperture 18a no longer overlaps the first aperture 16a due to such deviation (i.e., a region which no longer achieves contact), and a region R1 in which leakage of light may occur. As can be seen from FIG. 18, when the second aperture 18a and the drain electrode 24 are deviated from their intended relative positioning due to misalignment, the size of the region R1 and the size of the region R2 are in tradeoff relationship.

This may imply that the shape of the second aperture 18a of the active matrix substrate 100B of the present embodiment is more preferable from the standpoint of suppressing leakage of light, and that the shape of the second aperture 18a of the active matrix substrate 100A of Embodiment 1 is more preferable from the standpoint of increasing the area of contact.

(Embodiment 3)

Figure 19:
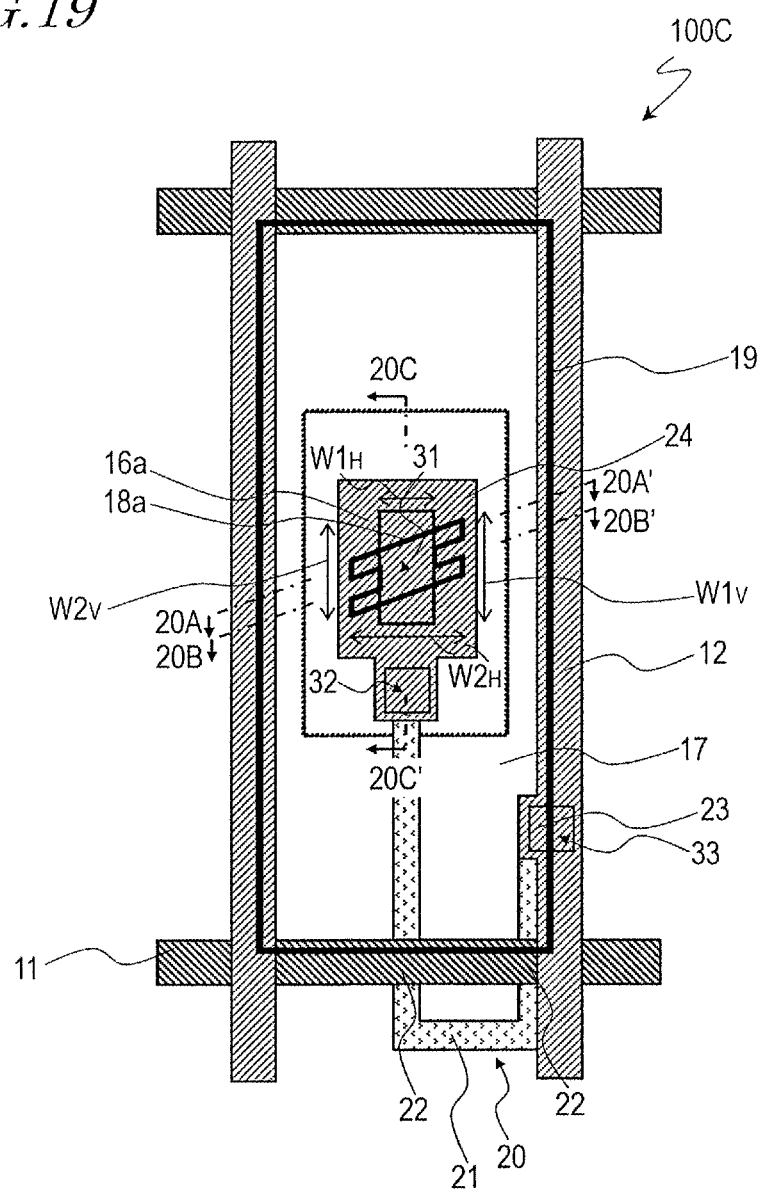
[FIG. 19] A diagram schematically showing an active matrix substrate 100C according to an embodiment of the present invention, as a plan view showing a region corresponding to one pixel.
Figure 20:
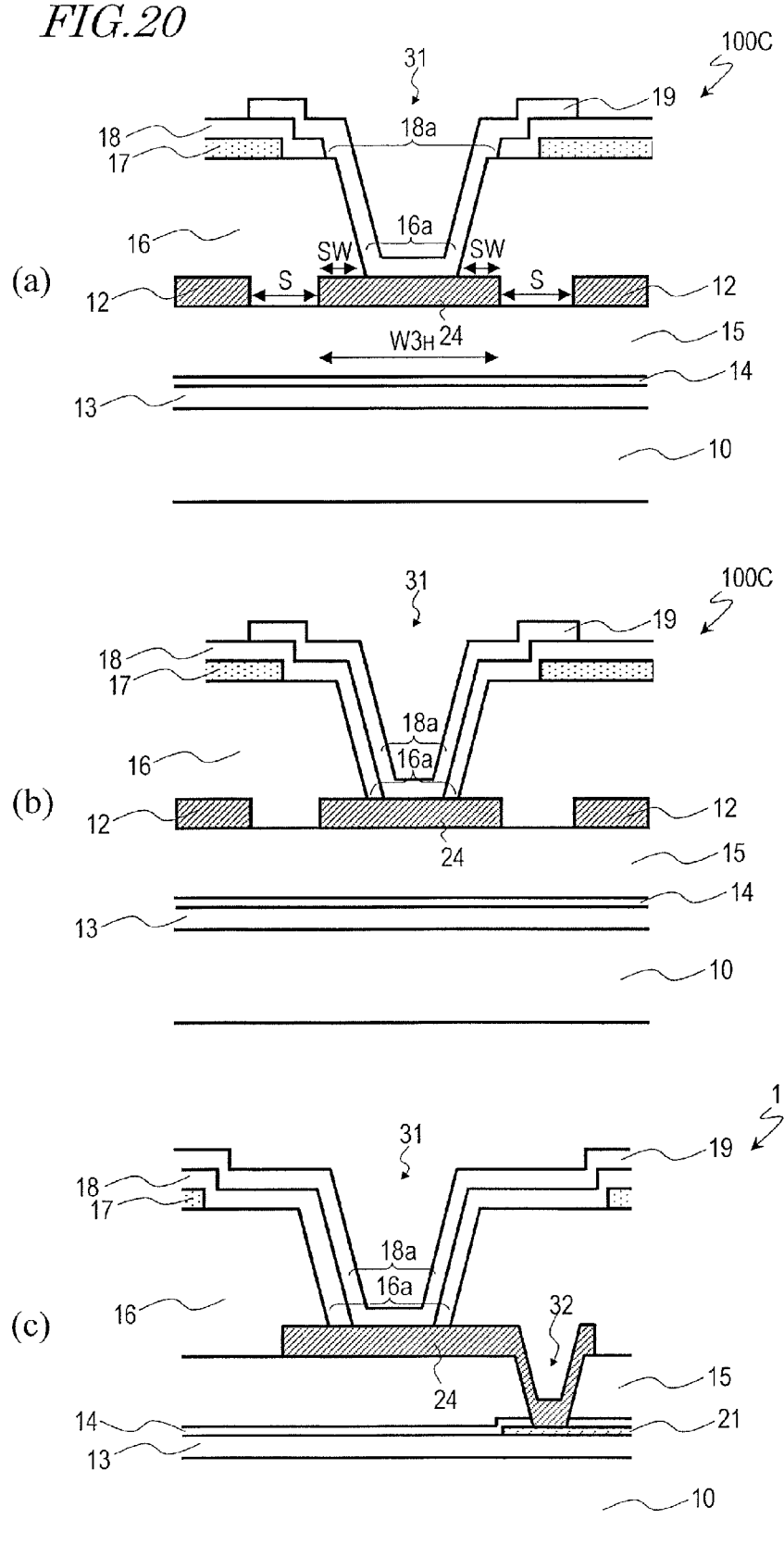
[FIG. 20] A diagram schematically showing the active matrix substrate 100C according to an embodiment of the present invention, where (a), (b), and (c) are cross-sectional views taken along line 20A-20A', line 20B-20B', and line 20C-20C' in FIG. 19, respectively.

FIG. 19 and FIG. 20 show an active matrix substrate 100C according to the present embodiment. FIG. 19 is a plan view schematically showing the active matrix substrate 100C. FIGS. 20(a), (b), and (c) are cross-sectional views taken along line 20A-20A', line 20B-20B', and line 20C-20C' in FIG. 19, respectively.

In the active matrix substrate 100C, similarly to the active matrix substrate 100A of Embodiment 1, the width $W1_H$ of the first aperture 16a along the horizontal direction (first direction) is smaller than the width $W2_H$ of the second aperture 18a along the horizontal direction. Moreover, when viewed from the normal direction of the substrate 10, portions of the contour of the second aperture 18a are located inside the contour of the first aperture 16a. Therefore, while securing a performance and an interconnection resistance equivalent to those of the active matrix substrate 1000 of Comparative Example 1, the definition up to which manufacture is possible is improved.

In the active matrix substrate 100C, too, similarly to the active matrix substrate 100A of Embodiment 1, the contour of the second aperture 18a is not rectangular. However, the shape of the second aperture 18a of the active matrix substrate 100C is different from the shape of the second aperture 18a of the active matrix substrate 100A of Embodiment 1.

Figure 21:
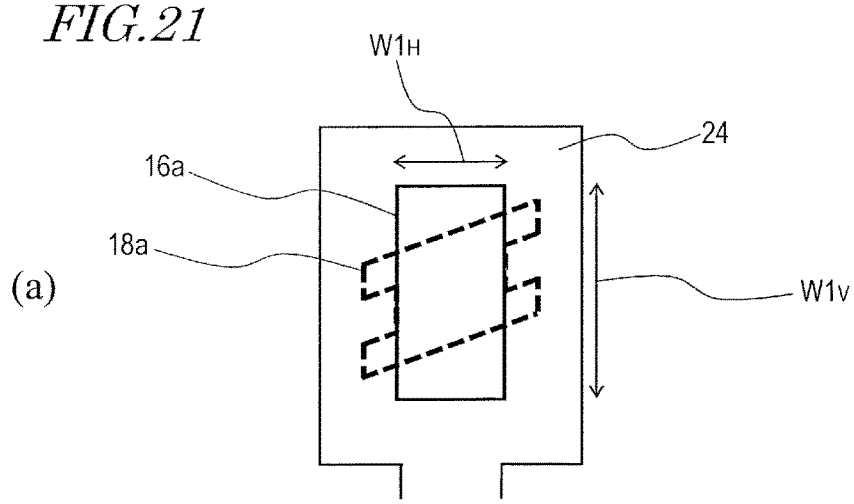
[FIG. 21] (a) and (b) are diagrams showing enlarged the neighborhood of a first aperture 16a and a second aperture 18a in the active matrix substrate 100C according to an embodiment of the present invention.

Now, with reference to FIGS. 21(a) and (b), the shapes and positioning of the first aperture 16a and the second aperture 18a will be described in more detail. FIGS. 21(a) and (b) are diagrams showing enlarged the neighborhood of the first aperture 16a and the second aperture 18a. In FIG. 21(a), the contour of the first aperture 16a is shown with a solid line, whereas the contour of the second aperture 18a is shown with a broken line. On the other hand, in FIG. 21(b), the contour of the first aperture 16a is shown with a broken line, whereas the contour of the second aperture 18a is shown with a solid line.

When viewed from the normal direction of the substrate 10, the contour of the first aperture 16a is rectangular, as shown in FIG. 21(a). On the other hand, the contour of the second aperture 18a is not rectangular, as shown in FIG. 21(b).

When viewed from the normal direction of the substrate 10, portions of the contour of the second aperture 18a are located inside the contour of the first aperture 16a. More specifically, the contour of the second aperture 18a includes two sides (an upper side and a lower side) which are inclined with respect to the horizontal direction, each being located partially inside the contour of the first aperture 16a.

Moreover, the second aperture 18a includes a first portion 18a1 overlapping the first aperture 16a, and a plurality of second portions 18a2 extending from the first portion 18a1 and not overlapping the first aperture 16a. In the present embodiment, the second aperture 18a includes four second portions 18a2. Two of the four second portions 18a2 are located on one side (left-hand side) of the first portion 18a1 along the horizontal direction (first direction), whereas the other two are located on the other side (right-hand side). More specifically, the former two second portions 18a2 extend from the upper left and from the lower left of the first portion 18a1, whereas the latter two second portions 18a2 extend from the upper right and from the lower right of the first portion 18a1.

As described above, the contour of the second aperture 18a includes an upper side and a lower side which are inclined with respect to the horizontal direction. Therefore, the first portion 18a1 is a non-rectangular parallelogram (which herein is a rhombus which is not a rectangle).

Thus, the contour of the second aperture 18a is an H-shape which is inclined with respect to the horizontal direction and the vertical direction. Therefore, it can be said that the second aperture 18a is formed so that the area of the portions of the second aperture 18a not overlapping the first aperture 16a is smaller than that in an imaginary case where the contour of the second aperture 18a is a rectangle whose width along the horizontal direction (first direction) and width along the vertical direction (second direction) are identical to those of the contour of the second aperture 18a. As a result, degradation of display quality due to disorderly alignment and leakage of light is suppressed.

It can be said that the second aperture 18a according to the present embodiment is formed so that the area of the portions of the second aperture 18a not overlapping the first aperture 16a is smaller than that in an imaginary case where the contour of the second aperture 18a is a (non-rectangular) parallelogram whose width along the horizontal direction (first direction) and whose width along the vertical direction (second direction) are identical to those of the contour of the second aperture 18a (i.e., an imaginary case where the two second portions 18a1 which are on the same side of the first portion 18a1 are continuous).

Figure 22:
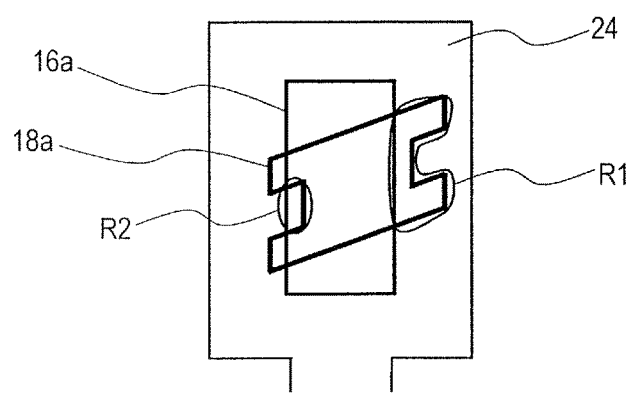
[FIG. 22] A diagram showing the second aperture 18a and a drain electrode 24 being deviated from their intended relative positioning due to misalignment in the active matrix substrate 100C according to an embodiment of the present invention.

FIG. 22 shows the second aperture 18a and the drain electrode 24 being deviated from their intended relative positioning due to misalignment. FIG. 22 also shows a region R2 in which the second aperture 18a no longer overlaps the first aperture 16a due to such deviation (i.e., a region which no longer achieves contact), and a region R1 in which leakage of light may occur. As can be seen from FIG. 22, when the second aperture 18a and the drain electrode 24 are deviated from their intended relative positioning due to misalignment, the size of the region R1 and the size of the region R2 are in tradeoff relationship.

(Embodiment 4)

Figure 23:
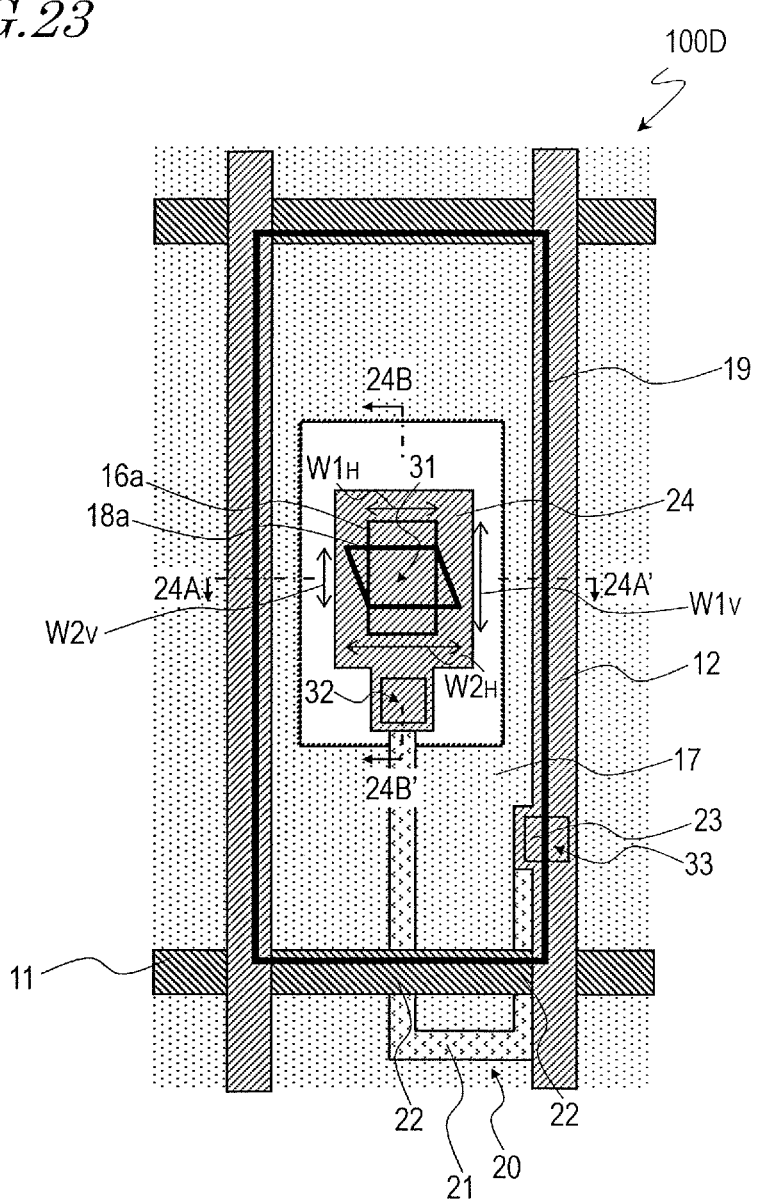
[FIG. 23] A diagram schematically showing an active matrix substrate 100D according to an embodiment of the present invention, as a plan view showing a region corresponding to one pixel.

FIG. 23 and FIG. 24 show an active matrix substrate 100D according to the present embodiment. FIG. 23 is a plan view schematically showing the active matrix substrate 100D. FIGS. 24(a) and (b) are cross-sectional views taken along line 24A-24A' and line 24B-24B' in FIG. 23, respectively.

In the active matrix substrate 100D, similarly to the active matrix substrate 100A of Embodiment 1, the width $W1_H$ of the first aperture 16a along the horizontal direction (first direction) is smaller than the width $W2_H$ of the second aperture 18a along the horizontal direction. Moreover, when viewed from the normal direction of the substrate 10, portions of the contour of the second aperture 18a are located inside the contour of the first aperture 16a. Therefore, while securing a performance and an interconnection resistance equivalent to those of the active matrix substrate 1000 of Comparative Example 1, the definition up to which manufacture is possible is improved.

In the active matrix substrate 100D, too, similarly to the active matrix substrate 100A of Embodiment 1, the contour of the second aperture 18a is not rectangular. However, the shape of the second aperture 18a of the active matrix substrate 100D is different from the shape of the second aperture 18a of the active matrix substrate 100A of Embodiment 1.

Figure 25:
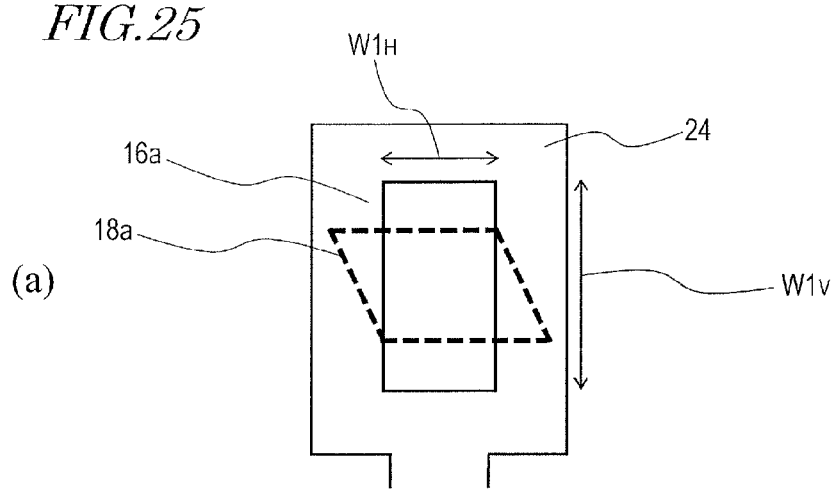
[FIG. 25] (a) and (b) are diagrams showing enlarged the neighborhood of a first aperture 16a and a second aperture 18a in the active matrix substrate 100D according to an embodiment of the present invention.

Now, with reference to FIGS. 25(a) and (b), the shapes and positioning of the first aperture 16a and the second aperture 18a will be described in more detail. FIGS. 25(a) and (b) are diagrams showing enlarged the neighborhood of the first aperture 16a and the second aperture 18a. In FIG. 25(a), the contour of the first aperture 16a is shown with a solid line, whereas the contour of the second aperture 18a is shown with a broken line. On the other hand, in FIG. 25(b), the contour of the first aperture 16a is shown with a broken line, whereas the contour of the second aperture 18a is shown with a solid line.

When viewed from the normal direction of the substrate 10, the contour of the first aperture 16a is rectangular, as shown in FIG. 25(a). On the other hand, the contour of the second aperture 18a is not rectangular, as shown in FIG. 25(b).

When viewed from the normal direction of the substrate 10, portions of the contour of the second aperture 18a are located inside the contour of the first aperture 16a. More specifically, the contour of the second aperture 18a includes two sides (an upper side and a lower side) which are substantially parallel to the horizontal direction, each being located partially inside the contour of the first aperture 16a.

Moreover, the second aperture 18a includes a first portion 18a1 overlapping the first aperture 16a, and a plurality of second portions 18a2 extending from the first portion 18a1 and not overlapping the first aperture 16a. In the present embodiment, the second aperture 18a includes two second portions 18a2. One of the two second portions 18a2 is located on one side (left-hand side) of the first portion 18a1 along the horizontal direction (first direction), while the other is located on the other side (right-hand side). More specifically, the former second portion 18a2 is a triangle extending from the left of the first portion 18a1, whereas the latter second portion 18a2 is a triangle extending from the right of the first portion 18a1.

Thus, the contour of the second aperture 18a is a non-rectangular parallelogram. Therefore, it can be said that the second aperture 18a is formed so that the area of the portions of the second aperture 18a not overlapping the first aperture 16a is smaller than that in an imaginary case where the contour of the second aperture 18a is a rectangle whose width along the horizontal direction (first direction) and width along the vertical direction (second direction) are identical to those of the contour of the second aperture 18a. As a result, degradation of display quality due to disorderly alignment and leakage of light is suppressed.

Moreover, in the active matrix substrate 100D of the present embodiment, the contour of the second aperture 18a is a non-rectangular parallelogram, which is a simpler shape than an H-shape; this provides a design advantage with respect to the photomask (i.e., a photomask for forming the second aperture 18a in the dielectric layer 18).

Figure 26:
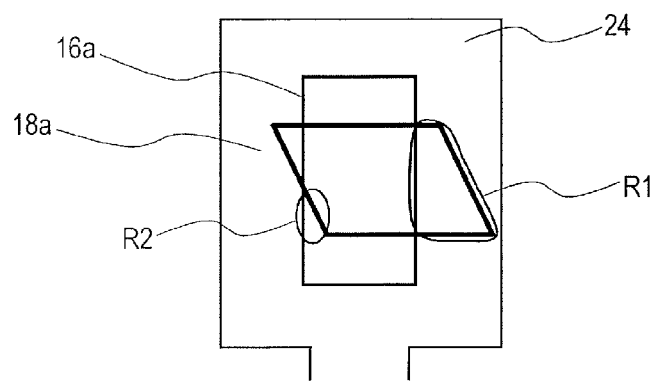
[FIG. 26] A diagram showing the second aperture 18a and a drain electrode 24 being deviated from their intended relative positioning due to misalignment in the active matrix substrate 100D according to an embodiment of the present invention.

FIG. 26 shows the second aperture 18a and the drain electrode 24 being deviated from their intended relative positioning due to misalignment. FIG. 26 also shows a region R2 in which the second aperture 18a no longer overlaps the first aperture 16a due to such deviation (i.e., a region which no longer achieves contact), and a region R1 in which leakage of light may occur. As can be seen from FIG. 26, when the second aperture 18a and the drain electrode 24 are deviated from their intended relative positioning due to misalignment, the size of the region R1 and the size of the region R2 are in tradeoff relationship.

(Embodiment 5)

Figure 27:
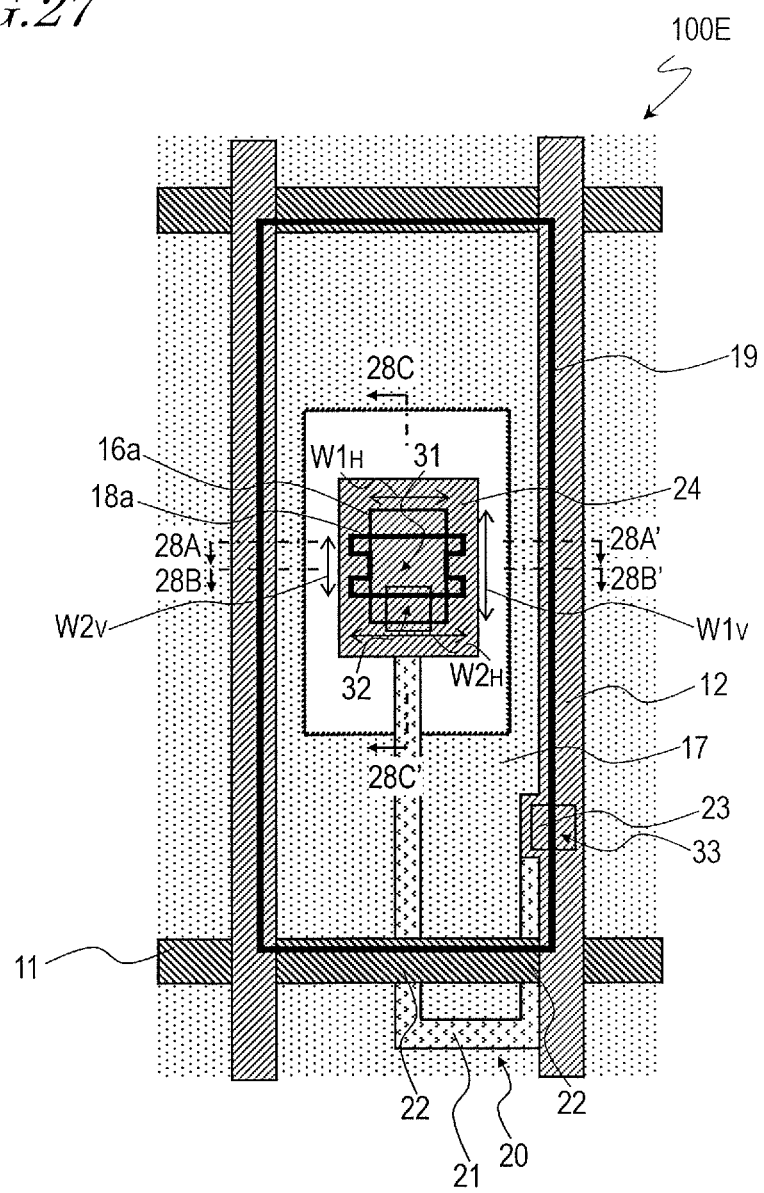
[FIG. 27] A diagram schematically showing an active matrix substrate 100E according to an embodiment of the present invention, as a plan view showing a region corresponding to one pixel.
Figure 28:
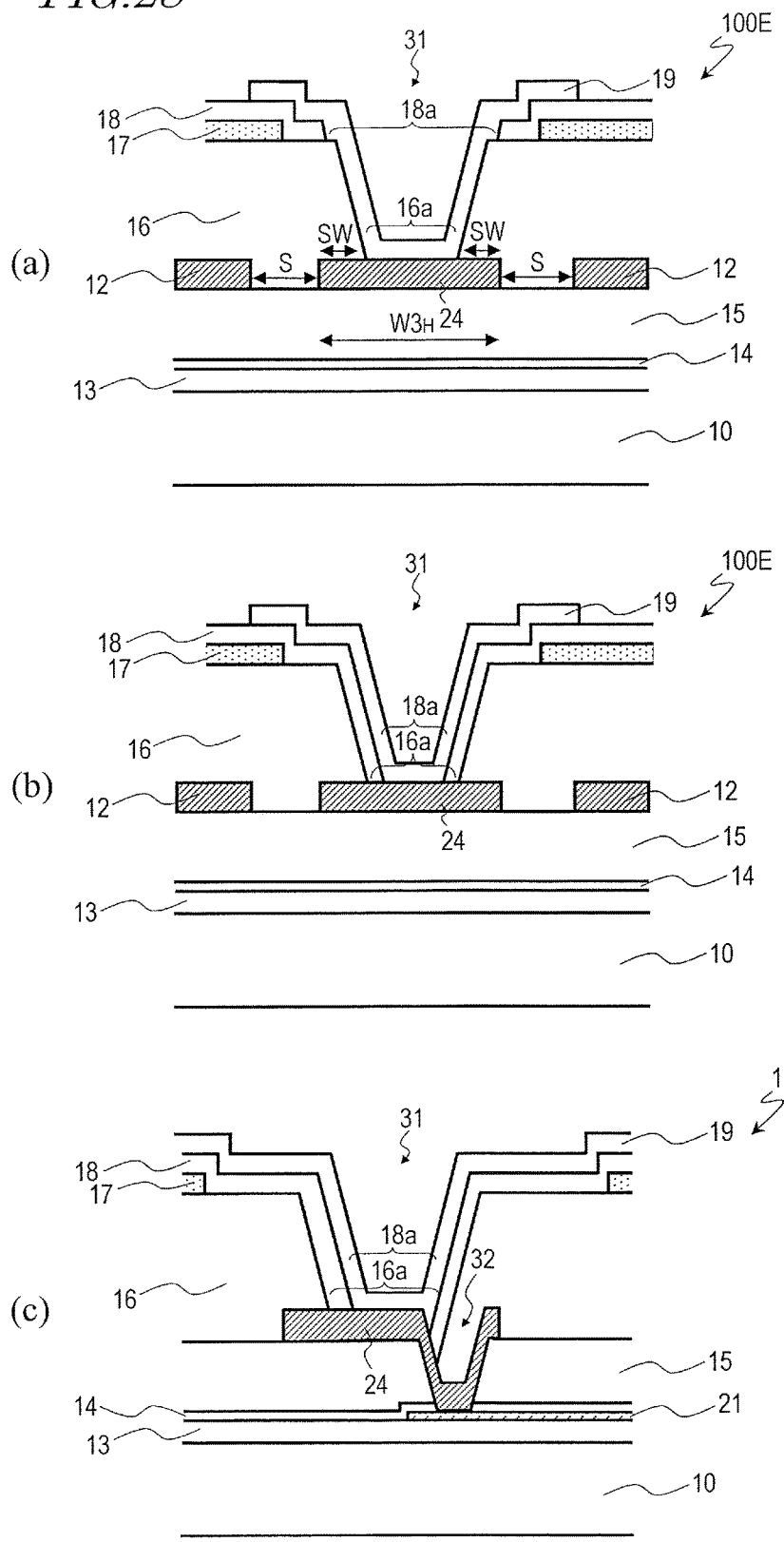
[FIG. 28] A diagram schematically showing the active matrix substrate 100E according to an embodiment of the present invention, where (a), (b), and (c) are cross-sectional views taken along line 28A-28A', line 28B-28B', and line 28C-28C' in FIG. 27, respectively.

FIG. 27 and FIG. 28 show an active matrix substrate 100E according to the present embodiment. FIG. 27 is a plan view schematically showing the active matrix substrate 100E, whereas FIGS. 28(a), (b), and (c) are cross-sectional views taken along line 28A-28A', line 28B-28B', and line 28C-28C' in FIG. 27, respectively.

The active matrix substrate 100E of the present embodiment differs from the active matrix substrate 100A of Embodiment 1 in terms of positioning of the second contact holes 32 formed in the gate insulating layer 14 and the second interlayer insulating layer 15.

In the active matrix substrate 100A of Embodiment 1, as shown in FIG. 1 and FIG. 2(*c*), the second contact hole 32 does not overlap the first contact hole 31 when viewed from the normal direction of the substrate 10.

On the other hand, in the active matrix substrate 100E of the present embodiment, as shown in FIG. 27 and FIG. 28(*c*), at least a portion of the second contact hole 32 overlaps the first contact hole 31 when viewed from the normal direction of the substrate 10. Moreover, when viewed from the normal direction of the substrate 10, the center of the first contact hole 31 and the center of the second contact hole 32 are deviated.

In the active matrix substrate 100E of the present embodiment, as described above, at least a portion of the second contact hole 32 overlaps the first contact hole 31, so that the size of the drain electrode 24 can be further reduced. Therefore, the aperture ratio can be further improved.

Note that, when adopting a construction in which at least a portion of the second contact hole 32 overlaps the first contact hole 31 as in the present embodiment, it is preferable that the center of the first contact hole 31 and the center of the second contact hole 32 are deviated, as illustrated in FIG. 27 and FIG. 28(*c*). The reason is that, if the center of the first contact hole 31 coincides with the center of the second contact hole 32, the film thickness to be etched when forming the second apertures 18*a* in the dielectric layer 18 will extremely increase, thus leading to a possibility that the dielectric layer 18 cannot be apertured.

Although Embodiments 1 to 5 above illustrate TFTs 20 of the top gate type, the present invention is not limited thereto. Bottom-gate type TFTs may be used as the TFTs 20. In that case, the gate insulating layer 14 is provided so as to cover the gate electrodes 22. Moreover, the second interlayer insulating layer 15 is provided so as to cover the semiconductor layer 21. Furthermore, the second contact holes 32 are not formed in the gate insulating layer 14, but are only formed in the second interlayer insulating layer 15.

(Liquid Crystal Display Device Construction)

Now, a specific construction for a liquid crystal display device in which the active matrix substrates 100A to 100E of Embodiments 1 to 5 may be used will be described.

Figure 29:
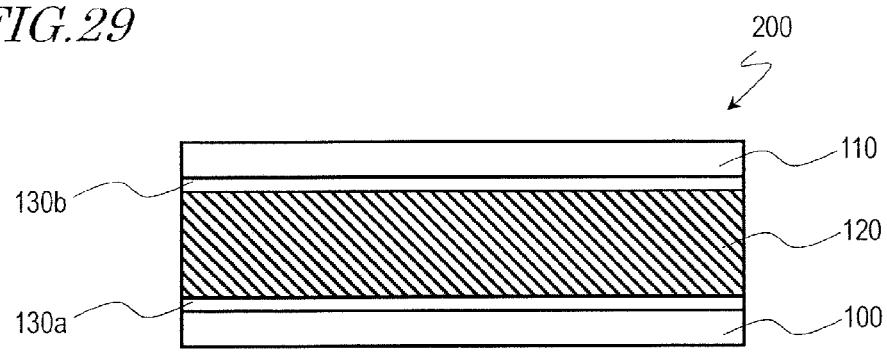
[FIG. 29] A cross-sectional view schematically showing a liquid crystal display device 200 in which the active matrix substrates 100A to 100D according to preferred embodiments of the present invention may be used.

A liquid crystal display device 200 shown in FIG. 29 includes an active matrix substrate 100, a counter substrate 110, and a liquid crystal layer 120.

The active matrix substrate 100 is, for example, one of the active matrix substrates 100A to 100E of Embodiments 1 to 5.

The counter substrate 110 is provided opposite from the active matrix substrate 100. Typically, color filters (not shown) are provided on the counter substrate 110. Moreover, in display modes (e.g., the VA mode) where a vertical electric field is applied across the liquid crystal layer 120, a counter electrode (common electrode; not shown) opposing the pixel electrodes (the upper layer electrodes 19 shown in FIG. 1 and so on) is provided on the counter substrate 110. In display modes (e.g., the FFS mode) where a lateral electric field is applied across the liquid crystal layer 120, a common electrode is provided on the active matrix substrate 100. For example, the lower layer electrode 17 in a two-layer electrode structure may be allowed to function as a common electrode.

The liquid crystal layer 120 is provided between the active matrix substrate 100 and the counter substrate 110. As the liquid crystal layer 120, a vertical-alignment type liquid crystal layer is used under the VA mode, and a horizontal-alignment type liquid crystal layer is used under the FFS mode.

On the respective surfaces of the active matrix substrate 100 and the counter substrate 110 facing the liquid crystal layer 120, alignment films 130*a* and 130*b* are provided. As the alignment films 130*a* and 130*b*, vertical alignment films or horizontal alignment films are to be used, depending on the display mode.

Typically, a pair of polarizers which oppose each other via the liquid crystal layer 120 are provided. Furthermore, as necessary, a phase plate(s) is provided on the rear face side and/or the viewer side of the liquid crystal layer 120.

Hereinafter, an example of a specific pixel structure when adopting the VA mode or the FFS mode for the liquid crystal display device 200 will be described. In the examples described below, the shapes and positioning of the first apertures 16*a* and the second apertures 18*a* in the active matrix substrate 100 are identical to those in the active matrix substrate 100A of Embodiment 1.

Figure 30:
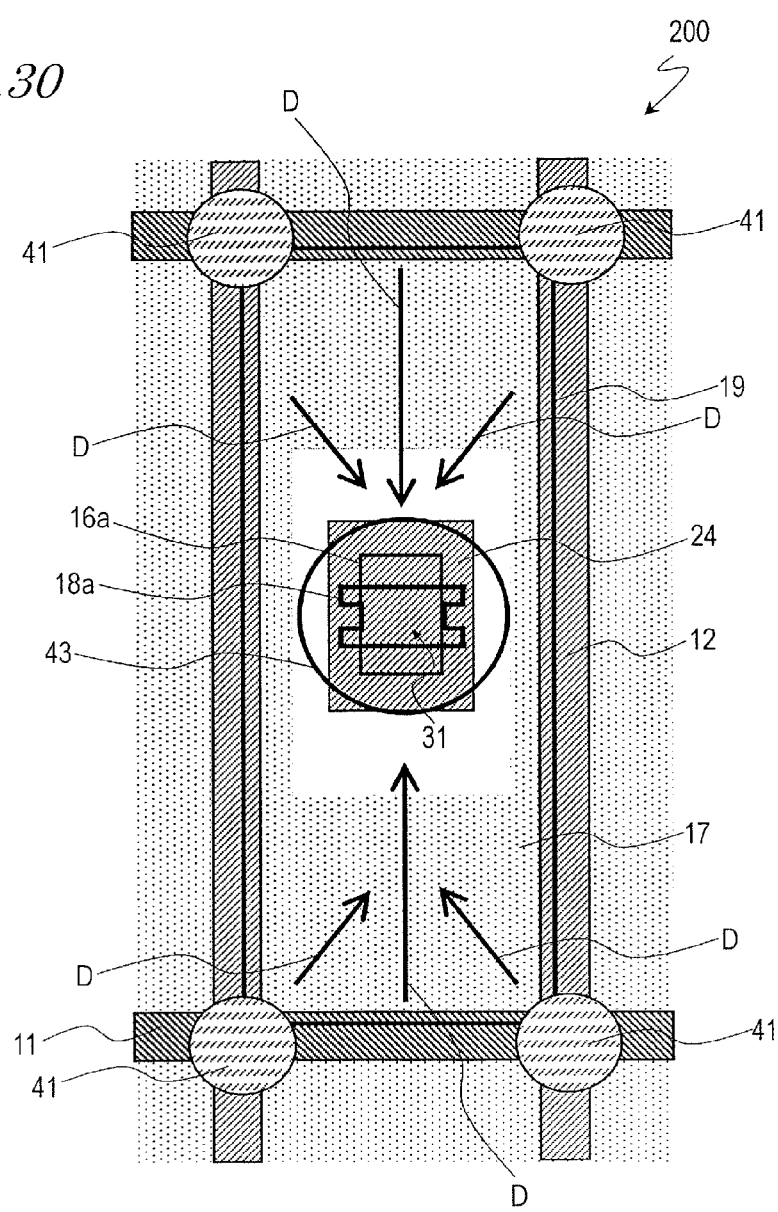
[FIG. 30] A diagram showing an example pixel structure when adopting the VA mode for the liquid crystal display device 200, as a plan view showing a region corresponding to one pixel.

FIG. 30 shows an example pixel structure under the VA mode. In the example shown in FIG. 30, the upper layer electrodes 19 functioning as pixel electrodes are so-called spread electrodes. A plurality of columnar spacers 41 are formed on the active matrix substrate 100. Each columnar spacer 41 is disposed at an intersection between a scanning line 11 and a signal line 12. In other words, four columnar spacers 41 are disposed at the four corners of each pixel in total. In the counter electrode on the counter substrate 110, an aperture 43 is formed in a region corresponding to the center of each pixel.

Each columnar spacer 41 provides an alignment regulating force which aligns the liquid crystal molecules perpendicularly to the side face thereof. Moreover, each aperture 43 in the counter electrode exhibits an alignment regulating force which, under an applied voltage, inclines the liquid crystal molecules in a direction that is orthogonal to the edge thereof. Therefore, when a voltage is applied across the liquid crystal layer 120, a liquid crystal domain that takes an axisymmetric alignment (radially-inclined alignment) is created in each pixel. FIG. 16 shows the alignment directions of liquid crystal molecules under an applied voltage with arrows D. In one liquid crystal domain, the liquid crystal molecules are aligned in essentially all azimuth directions, whereby good viewing angle characteristics are obtained.

Figure 31:
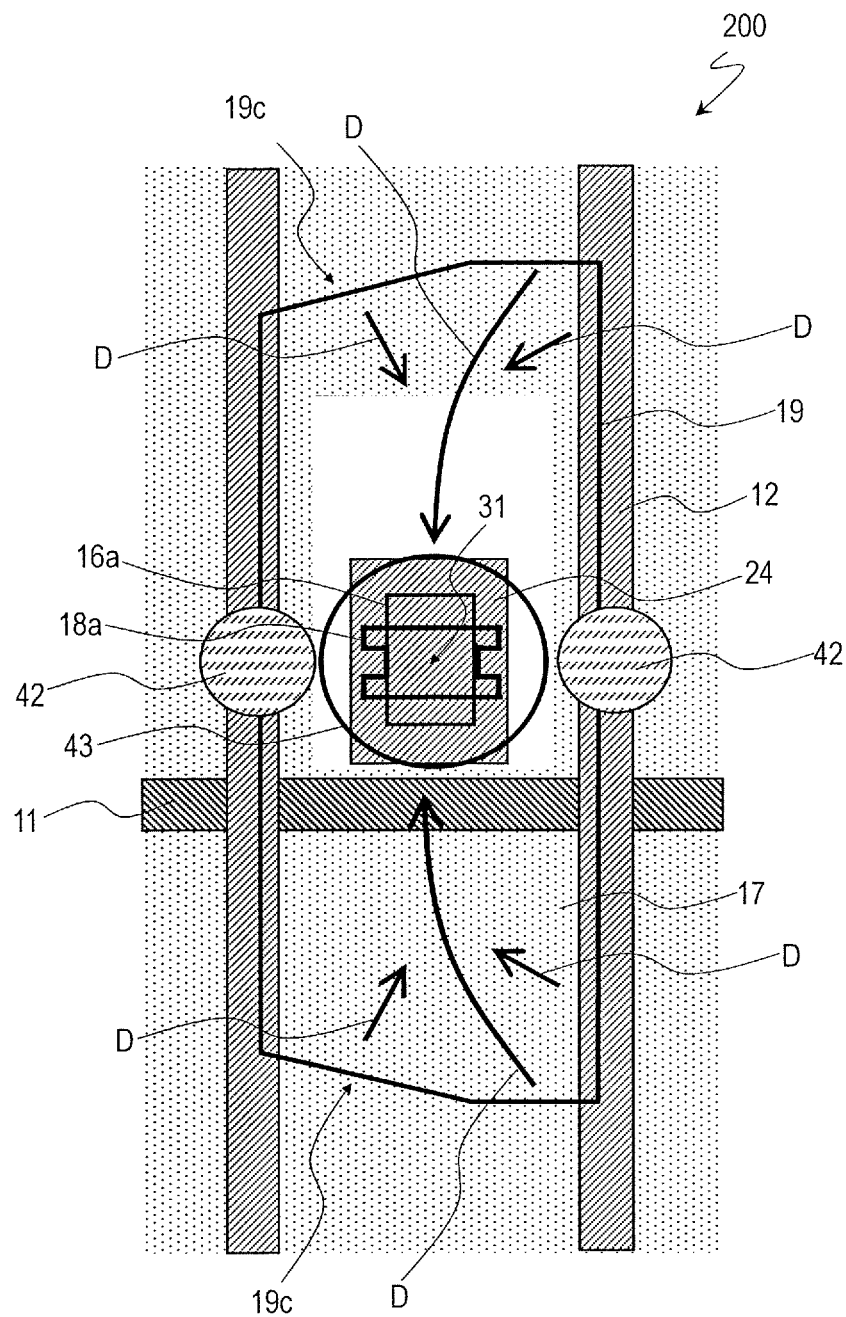
[FIG. 31] A diagram showing another example pixel structure when adopting the VA mode for the liquid crystal display device 200, as a plan view showing a region corresponding to one pixel.

FIG. 31 shows another example pixel structure in the case where the VA mode is adopted. In the example shown in FIG. 31, too, in the counter electrode on the counter substrate 110, an aperture 43 is formed in a region corresponding to the center of each pixel. However, in the example shown in FIG. 31, a plurality of columnar spacers 42 are formed not on the active matrix substrate 100 but on the counter substrate 110. Moreover, each columnar spacer 42 is disposed so as to overlap a signal line 12, and, along the vertical direction, located near the center of each pixel.

In the example shown in FIG. 31, too, when a voltage is applied across the liquid crystal layer 120, the alignment regulating force of the columnar spacers 42 and the alignment regulating force of the apertures 43 in the counter electrode cause a liquid crystal domain having an axisymmetric alignment to be created in each pixel. The direction of the alignment regulating force exerted on the liquid crystal molecules is different between the columnar spacers 41 formed on the active matrix substrate 100 and the columnar spacers 42 formed on the counter substrate 110; therefore, in order to reflect this difference, different planar positioning schemes are adopted for the columnar spacers 41 formed on the active matrix substrate 100 and the columnar spacers 42 formed on the counter substrate 110.

In the example shown in FIG. 31, bevels 19c are formed in the upper left corner and lower left corner of the upper layer electrode 19 functioning as a pixel electrode. This is in order to improve display quality by restricting the positions of centers of alignment that form in between pixels. Under an applied voltage across the liquid crystal layer 120, centers of alignment are created not only at the center of each aperture 43 in the counter electrode (pixel center), but also between any two pixels adjoining along the up-down direction (the vertical direction on the display surface). The alignment regulating force that creates such a center of alignment between pixels may be weakened under the influence of various conditions such as the cell thickness, how the electrode pattern of pixel electrodes is finished, the pretilt angle (in the case where a PSA technique as disclosed in Japanese Laid-Open Patent Publication No. 2002-357830 is applied), and so on. Therefore, the positions of the centers of alignment along the right-left direction may fluctuate from pixel to pixel. These fluctuations may cause deteriorations in display quality, such as displaying coarseness and abnormal coloration when the viewing angle is inclined along the right-left direction. By forming the bevels 19c in the upper layer electrodes 19, it becomes possible to restrict the positions of the centers of alignment between upper and lower pixels. Specifically, when the bevels 19c are formed at the left-hand side (the upper left corner and lower left corner) of the upper layer electrodes 19 as described above, the centers of alignment can be stabilized at the side where the interval between pixel electrodes (i.e., between upper layer electrodes 19) is narrower (i.e., at the right-hand side where the bevels 19c are not formed).

Although the example shown in FIG. 31 illustrates that the scanning line 11 is disposed across the neighborhood of the center of the pixel, the position of the scanning line 11 is not limited thereto. However, in the case where columnar spacers 42 are formed on the counter substrate 110, in order to prevent leakage of light near the columnar spacers 42, it is preferable to provide a stripe-shaped black matrix (light shielding layer) that extends along the horizontal direction on the counter substrate 110, in order to shade a region of 3 µm to 5 µm around each columnar spacer 42. Therefore, as shown in FIG. 31, the scanning line 11 may be disposed across the neighborhood of the pixel center so as to overlap the black matrix on the counter substrate 110, thereby realizing a high aperture ratio.

Figure 32:
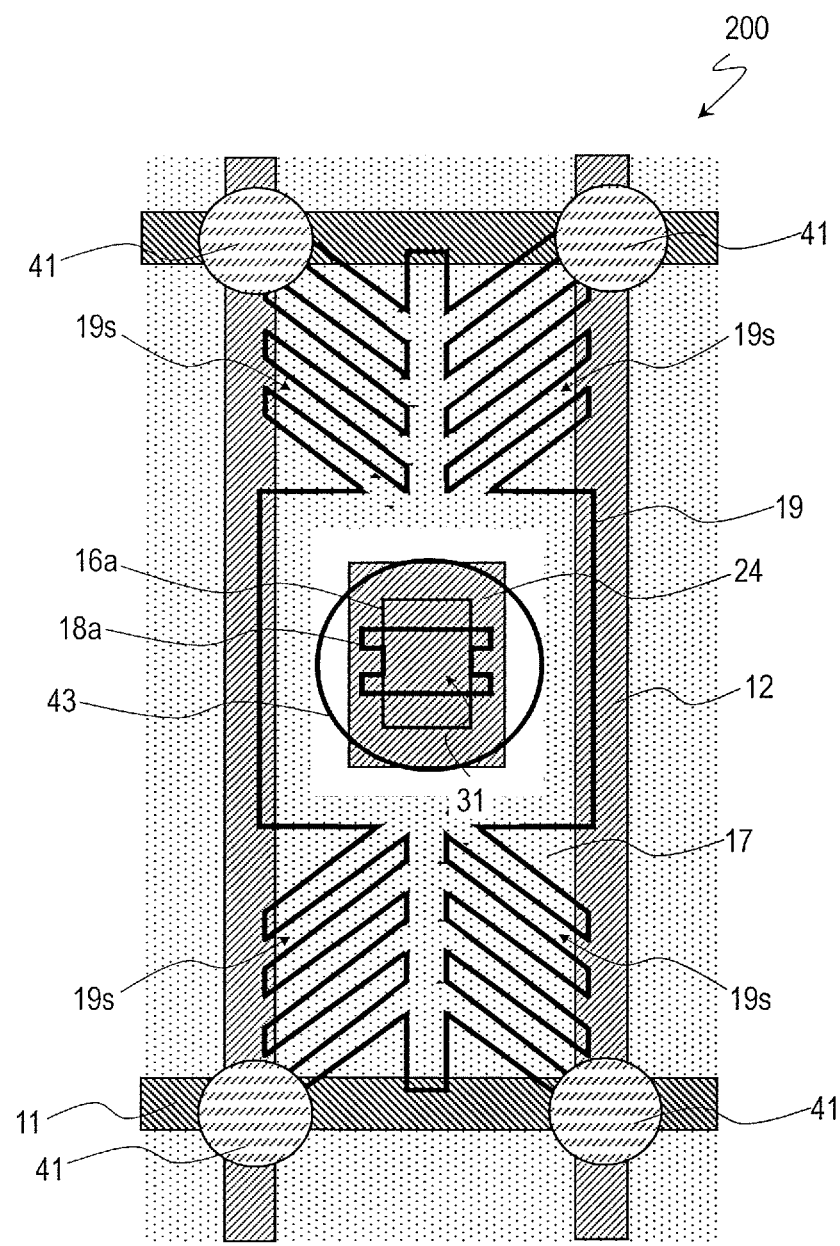
[FIG. 32] A diagram showing still another example pixel structure when adopting the VA mode for the liquid crystal display device 200, as a plan view showing a region corresponding to one pixel.
Figure 33:
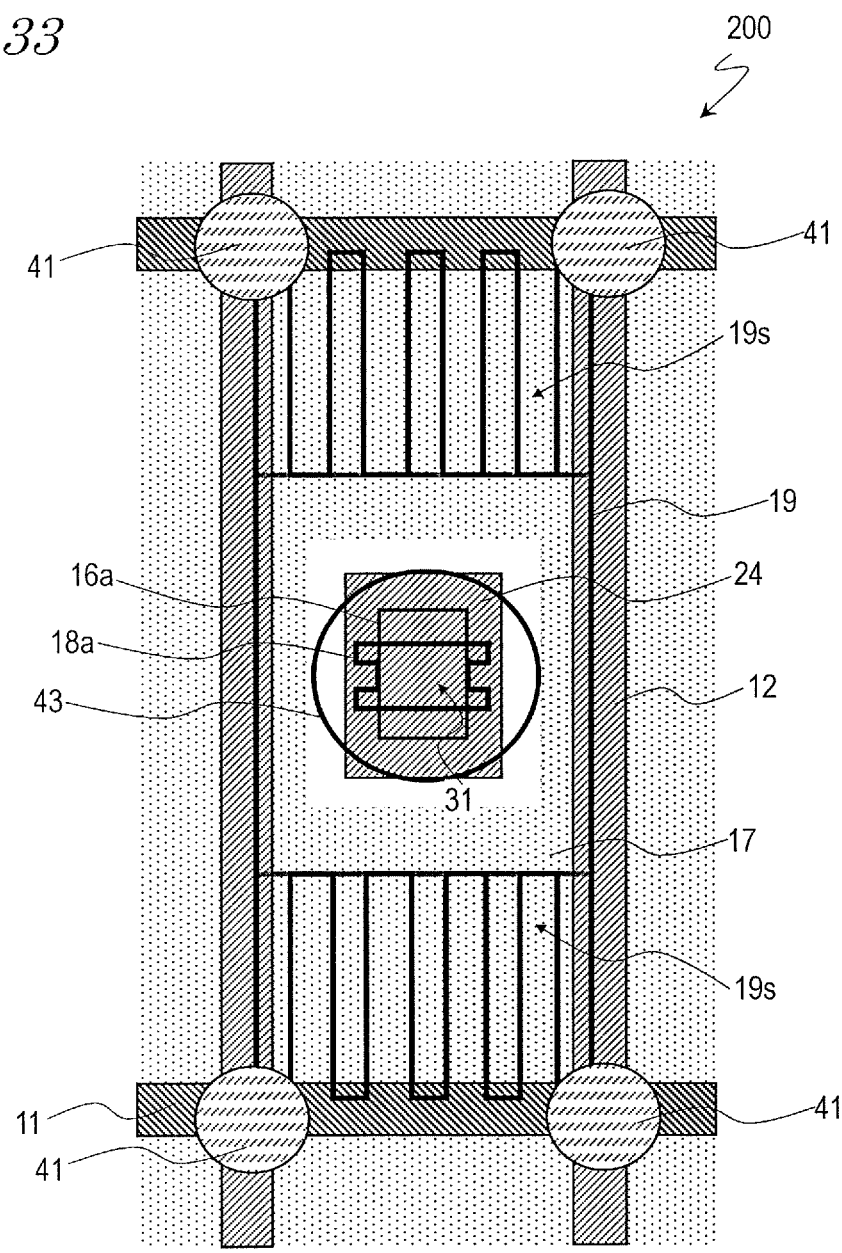
[FIG. 33] A diagram showing still another example pixel structure when adopting the VA mode for the liquid crystal display device 200, as a plan view showing a region corresponding to one pixel.

FIG. 32 and FIG. 33 show still another example pixel structure under the VA mode. In the examples shown in FIG. 32 and FIG. 33, a plurality of columnar spacers 41 are formed on the active matrix substrate 100. Each columnar spacer 41 is disposed at an intersection between a scanning line 11 and a signal line 12. In other words, four columnar spacers 41 are disposed at the four corners of each pixel in total. In the counter electrode on the counter substrate 110, an aperture 43 is formed in a region corresponding to the center of each pixel.

Furthermore, in the example shown in FIG. 32 and

FIG. 33, the upper layer electrodes 19 functioning as pixel electrodes have a plurality of slits 19s. In the example shown in FIG. 32, the plurality of slits 19s extend substantially parallel to a direction which is at an angle of 45° with respect to the horizontal direction and the vertical direction. In the example shown in FIG. 33, the plurality of slits 19s extend substantially parallel to the vertical direction. Under an applied voltage, the slits 19s exhibit an alignment regulating force which inclines the liquid crystal molecules substantially parallel to the direction in which the slits 19s extend.

In the examples shown in FIG. 32 and FIG. 33, when a voltage is applied across the liquid crystal layer 120, alignment regulation is achieved by the alignment regulating force of the columnar spacers 41, the alignment regulating force of the apertures 43 in the counter electrode, and the alignment regulating force of the plurality of slits 19s in the upper layer electrodes (pixel electrodes) 19. In the examples shown in FIG. 32 and FIG. 33, due to the addition of the alignment regulating force of the plurality of slits 19s in the upper layer electrodes 19, the alignment state can be more stable and the response speed more improved than in the example shown in FIG. 30. Moreover, in the examples shown in FIG. 32 and FIG. 33, the effective applied voltage across the liquid crystal layer 120 differs between the regions of the upper layer electrodes 19 where the slits 19s are formed (i.e., the portion located above the pixel and the portion located below) and the region where the slits 19s are not formed (i.e., the portion located in the center of the pixel). Therefore, different, plural sets of γ characteristics (gray scale dependences of display luminance) are allowed to be mixedly present in one pixel, and displaying can be performed via their composition, whereby the viewing angle dependence of γ characteristics can be reduced. A viewing angle dependence of γ characteristics is a problematic difference between the γ characteristics when observed from the frontal direction and the γ characteristics when observed from an oblique direction, which is visually perceived as a color change when an intermediate gray scale tone is observed from an oblique direction (called "whitening" or "color shifting").

Figure 34:
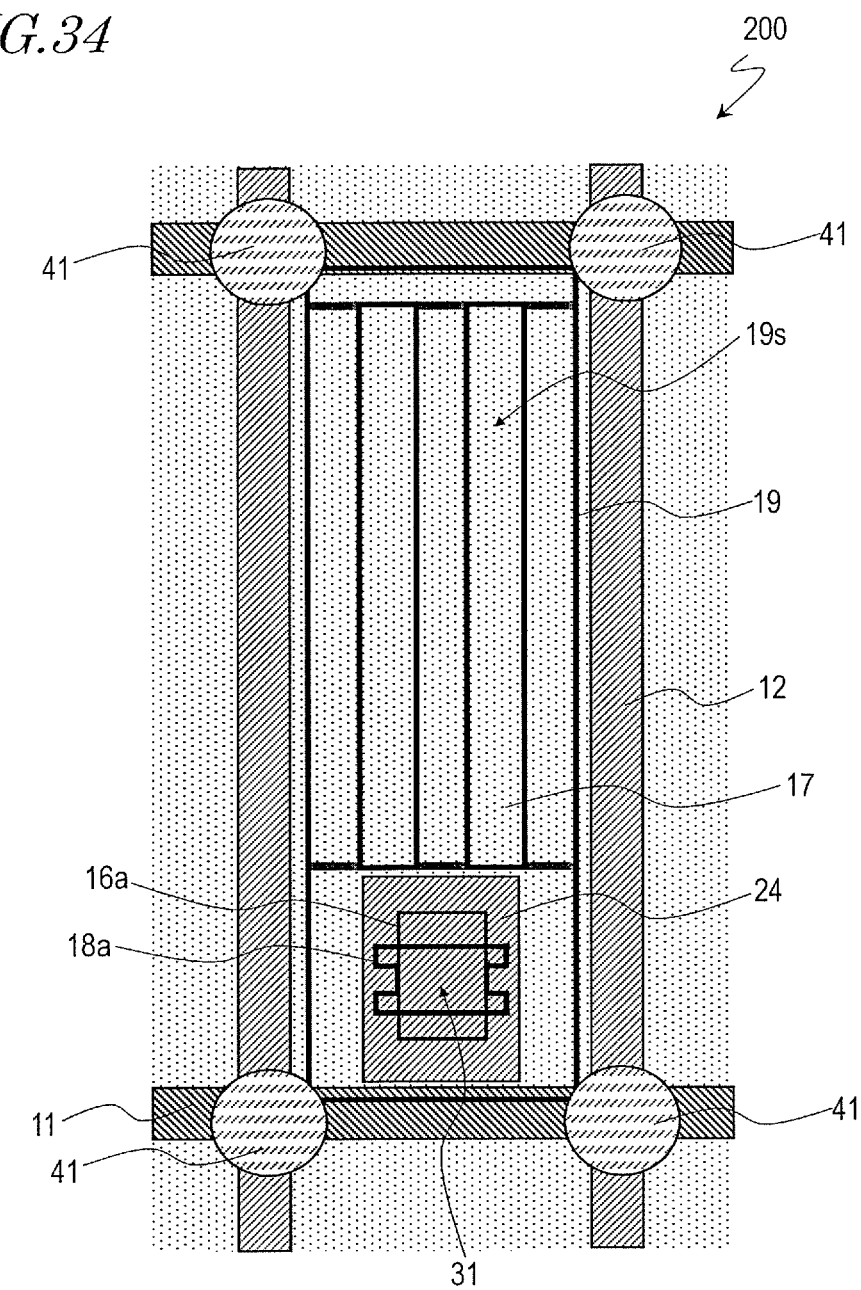
[FIG. 34] A diagram showing an example pixel structure when adopting the FFS mode for the liquid crystal display device 200, as a plan view showing a region corresponding to one pixel.
Figure 35:
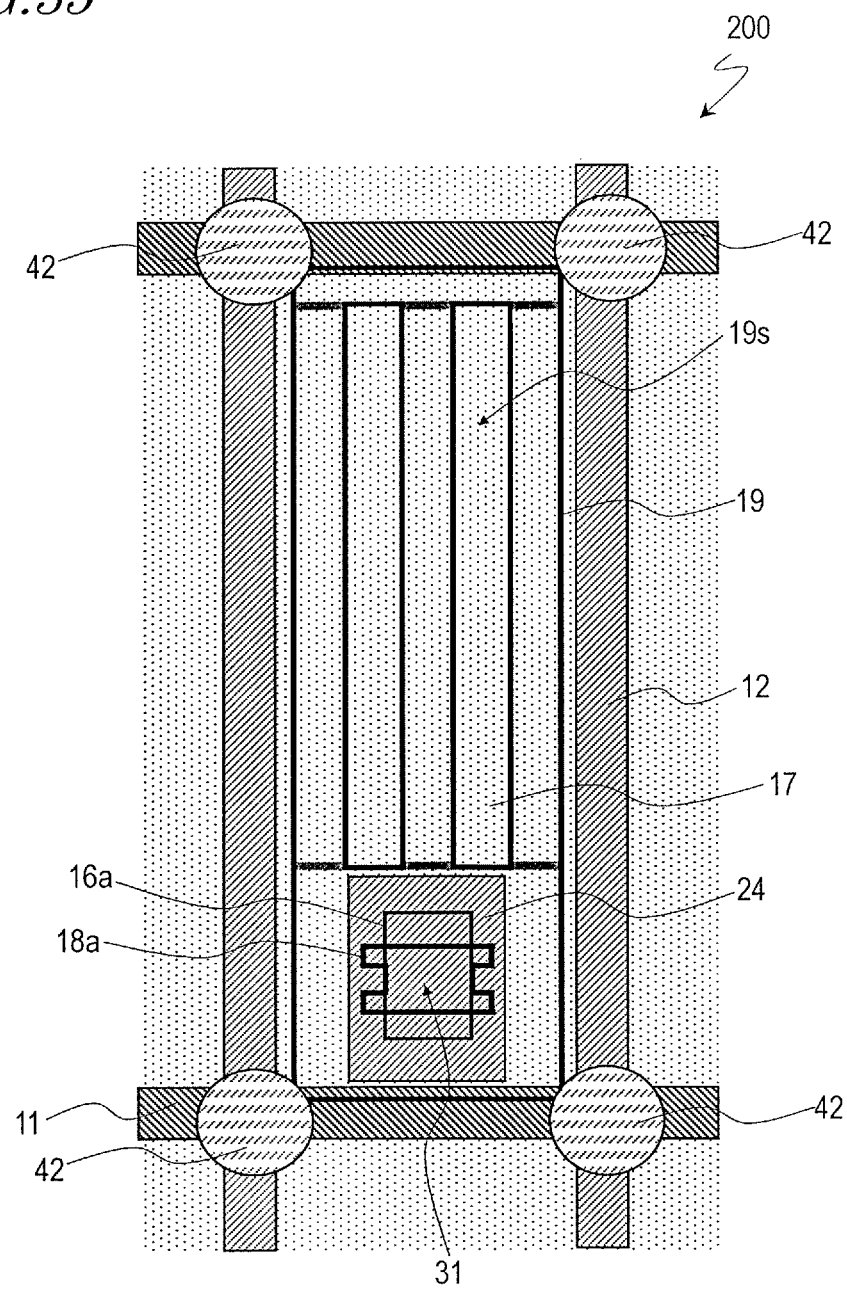
[FIG. 35] A diagram showing another example pixel structure when adopting the FFS mode for the liquid crystal display device 200, as a plan view showing a region corresponding to one pixel.

FIG. 34 and FIG. 35 show example pixel structures under the FFS mode. In the examples shown in FIG. 34 and FIG. 35, the upper layer electrodes 19 functioning as pixel electrodes have a plurality of slits 19s. The plurality of slits 19s extend substantially parallel to the vertical direction. Moreover, the lower layer electrode 17 functions as a common electrode.

In the examples shown in FIG. 34 and FIG. 35, when a potential difference is given between the upper layer electrode 19 and the lower layer electrode 17, a lateral electric field (oblique electric field) is generated, such that the lateral electric field controls the alignment state of liquid crystal molecules. In a display mode where a lateral electric field is applied across the liquid crystal layer 120, the alignment direction of the liquid crystal molecules varies within the display surface (i.e., the layer plane of the liquid crystal layer 120), whereby good viewing angle characteristics are obtained.

In the example shown in FIG. 34, a plurality of columnar spacers 41 are formed on the active matrix substrate 100. In the example shown in FIG. 35, a plurality of columnar spacers 42 are formed on the counter substrate 110.

INDUSTRIAL APPLICABILITY

According to an embodiment of the present invention, there is provided an active matrix substrate which can be produced with a higher definition than conventionally, in spite of having a two-layer electrode structure.

REFERENCE SIGNS LIST

10 substrate
11 scanning line
12 signal line 13 base coat layer
14 gate insulating layer
15 second interlayer insulating layer
16 first interlayer insulating layer
16a first aperture (aperture in first interlayer insulating layer)
17 lower electrode
18 dielectric layer
18a second aperture (aperture in dielectric layer)
18a1 first portion of second aperture
18a2 second portion of second aperture
19 upper electrode (pixel electrode)
19s slits
20 thin film transistor (TFT)
21 semiconductor layer
22 gate electrode
23 source electrode
24 drain electrode
31 first contact hole
32 second contact hole
33 third contact hole
41, 42 columnar spacer
43 aperture in counter electrode
100, 100A, 100B active matrix substrate
100C, 100D, 100E active matrix substrate

The invention claimed is:

1. An active matrix substrate comprising:
a substrate;
a thin film transistor being supported by the substrate and including a semiconductor layer, a gate electrode, a source electrode, and a drain electrode;
a scanning line provided so as to extend substantially parallel to a first direction, and electrically connected to the gate electrode of the thin film transistor;
a signal line provided so as to extend substantially parallel to a second direction orthogonal to the first direction, and electrically connected to the source electrode of the thin film transistor;
a first interlayer insulating layer provided so as to cover the thin film transistor;
a lower layer electrode provided on the first interlayer insulating layer;
a dielectric layer provided on the lower layer electrode; and
an upper layer electrode being provided on the dielectric layer and overlapping at least a portion of the lower layer electrode via the dielectric layer, wherein,
a first contact hole through which a portion of the drain electrode is exposed is formed in the first interlayer insulating layer and the dielectric layer, the first contact hole allowing the upper layer electrode to be electrically connected to the drain electrode;
the first contact hole includes a first aperture formed in the first interlayer insulating layer and a second aperture formed in the dielectric layer;
a width of the first aperture along one of the first direction and the second direction is smaller than a width of the second aperture along the one direction;
when viewed from a normal direction of the substrate,
a portion of the contour of the second aperture is located inside the contour of the first aperture, and the contour of the second aperture is not rectangular; and
an area of a portion of the second aperture that does not overlap the first aperture is smaller than a corresponding area of a portion of an imaginary rectangle, defined by the contour of the second aperture whose width along the first direction and whose width along the second direction are identical to those of the contour of the second aperture, that does not overlap the first aperture.

2. The active matrix substrate of claim 1, wherein, when viewed from the normal direction of the substrate, the contour of the first aperture is rectangular.

3. The active matrix substrate of claim 1, wherein,
when viewed from the normal direction of the substrate, the second aperture includes a first portion overlapping the first aperture, and a plurality of second portions extending from the first portion and not overlapping the first aperture; and
the plurality of second portions include at least one second portion located on one side of the first portion along the one direction and at least another second portion located on another side.

4. The active matrix substrate of claim 3, wherein,
the plurality of second portions are four second portions; and
two of the four second portions are located on one side of the first portion along the one direction, and the other two are located on another side.

5. The active matrix substrate of claim 3, wherein,
the plurality of second portions are two second portions; and
one of the two second portions is located on one side of the first portion along the one direction, and the other is located on another side.

6. The active matrix substrate of claim 1, wherein, when viewed from the normal direction of the substrate, the contour of the second aperture is H-shaped.

7. The active matrix substrate of claim 1, wherein, when viewed from the normal direction of the substrate, the contour of the second aperture is a parallelogram.

8. The active matrix substrate of claim 1, wherein, when viewed from the normal direction of the substrate, the contour of the second aperture includes two sides which are substantially parallel to the one direction, each being located partially inside the contour of the first aperture.

9. The active matrix substrate of claim 1, wherein, when viewed from the normal direction of the substrate, the contour of the second aperture includes two sides which are inclined with respect to the one direction, each being located partially inside the contour of the first aperture.

10. The active matrix substrate of claim 1, wherein a width of the first aperture along the other of the first direction and the second direction is greater than a width of the second aperture along the other direction.

11. The active matrix substrate of claim 1, further comprising:
a gate insulating layer provided between the semiconductor layer and the gate electrode; and
a second interlayer insulating layer provided so as to cover the gate electrode or the semiconductor layer, wherein,
between the gate insulating layer and the second interlayer insulating layer, at least the second interlayer insulating layer has a second contact hole formed therein through which a portion of the semiconductor layer is exposed, the second contact hole allowing the drain electrode to be electrically connected to the semiconductor layer; and
when viewed from the normal direction of the substrate, at least a portion of the second contact hole overlaps the first contact hole.

12. The active matrix substrate of claim 1, wherein the upper layer electrode and the lower layer electrode are each made of a transparent electrically conductive material.

13. The active matrix substrate of claim 1, wherein a width of the first aperture along the first direction is smaller than a width of the second aperture along the first direction.

14. The active matrix substrate of claim 1, wherein the semiconductor layer of the thin film transistor comprises an oxide semiconductor.

15. The active matrix substrate of claim 14, wherein the oxide semiconductor is an In—Ga—Zn—O-type semiconductor.

16. A liquid crystal display device comprising:
the active matrix substrate of claim 1;
a counter substrate provided opposite from the active matrix substrate; and
a liquid crystal layer provided between the active matrix substrate and the counter substrate.

17. The liquid crystal display device of claim 16 having a plurality of pixels in a matrix arrangement, wherein
the upper layer electrode functions as a pixel electrode.

18. A method of producing an active matrix substrate including:
a thin film transistor including a semiconductor layer, a gate electrode, a source electrode, and a drain electrode;
a scanning line provided so as to extend substantially parallel to a first direction, and electrically connected to the gate electrode of the thin film transistor; and
a signal line provided so as to extend substantially parallel to a second direction orthogonal to the first direction, and electrically connected to the source electrode of the thin film transistor, the method comprising:
step (A) of forming the thin film transistor on a substrate;
step (B) of forming an interlayer insulating layer covering the thin film transistor, the interlayer insulating layer having a first aperture;
step (C) of forming a lower layer electrode on the interlayer insulating layer;
step (D) of forming on the lower layer electrode a dielectric layer having a second aperture; and
step (E) of forming on the dielectric layer an upper layer electrode overlapping at least a portion of the lower layer electrode via the dielectric layer, the upper layer electrode being electrically connected to the drain electrode in a contact hole, the contact hole including the first aperture and the second aperture, wherein,
step (B) and step (D) are performed so that a width of the first aperture along one of the first direction and the second direction is smaller than a width of the second aperture along the one direction, and that, when viewed from a normal direction of the substrate, a portion of the contour of the second aperture is located inside the contour of the first aperture; and
step (B) and step (D) are performed further so that, when viewed from the normal direction of the substrate, the contour of the second aperture is not rectangular, and that an area of a portion of the second aperture that does not overlap the first aperture is smaller than a corresponding area of a portion of an imaginary rectangle, defined by the contour of the second aperture whose width along the first direction and whose width along the second direction are identical to those of the contour of the second aperture, that does not overlap the first aperture.

* * * * *